(12) United States Patent
Kim

(10) Patent No.: US 8,717,832 B2
(45) Date of Patent: May 6, 2014

(54) NONVOLATILE MEMORY DEVICES, MEMORY SYSTEMS AND METHODS OF PERFORMING READ OPERATIONS

(71) Applicant: Samsung Electronics Co., Ltd., Suwon-Si (KR)

(72) Inventor: Seung-Bum Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/048,944

(22) Filed: Oct. 8, 2013

(65) Prior Publication Data

US 2014/0036593 A1    Feb. 6, 2014

Related U.S. Application Data

(62) Division of application No. 13/032,855, filed on Feb. 23, 2011, now Pat. No. 8,582,365.

(60) Provisional application No. 61/361,545, filed on Jul. 6, 2010.

(30) Foreign Application Priority Data

Jul. 6, 2010 (KR) .......................... 10-2010-0064665

(51) Int. Cl.
  *G11C 7/00* (2006.01)
(52) U.S. Cl.
  USPC ............. 365/189.15; 365/185.22; 365/233.17

(58) Field of Classification Search
  USPC .......................... 365/189.13, 185.22, 233.17
  See application file for complete search history.

(56) References Cited

U.S. PATENT DOCUMENTS

| | | | |
|---|---|---|---|
| 6,907,497 B2 * | 6/2005 | Hosono et al. | 711/103 |
| 7,117,296 B2 * | 10/2006 | Hosono et al. | 711/103 |
| 7,130,236 B2 * | 10/2006 | Rajwani et al. | 365/208 |
| 7,359,274 B2 * | 4/2008 | Noguchi et al. | 365/230.03 |
| 7,463,539 B2 * | 12/2008 | Lin | 365/203 |
| 2008/0025099 A1 * | 1/2008 | Li et al. | 365/185.18 |
| 2009/0052255 A1 | 2/2009 | Moon et al. | |
| 2009/0244980 A1 | 10/2009 | Seol et al. | |

FOREIGN PATENT DOCUMENTS

| | | |
|---|---|---|
| JP | 2009070546 A | 4/2009 |
| KR | 100861648 B1 | 9/2008 |
| KR | 1020090019296 A | 2/2009 |
| KR | 1020090102262 A | 9/2009 |

* cited by examiner

Primary Examiner — Tuan T Nguyen
(74) Attorney, Agent, or Firm — Volentine & Whitt, PLLC

(57) ABSTRACT

Within a non-volatile memory device, a read operation directed to a nonvolatile memory cell having a positive threshold voltage applies a positive read voltage to a selected word line and a first control signal to a page buffer connected to a selected bit line, but if the memory cell has a negative threshold voltage the read operation applies a negative read voltage to the selected word line and a second control signal to the page buffer different from the first control signal.

13 Claims, 19 Drawing Sheets

NONVOLATILE MEMORY DEVICES, MEMORY SYSTEMS AND METHODS OF PERFORMING READ OPERATIONS

CROSS-REFERENCE TO RELATED APPLICATIONS

This application is a Divisional of application Ser. No. 13/032,855, filed Feb. 23, 2011, which claims priority under 35 U.S.C. §119 to Korean Patent Application No. 10-2010-64665 filed on Jul. 6, 2010, the subject matter of which is hereby incorporated by reference.

BACKGROUND OF THE INVENTION

The present disclosure is related to methods of operating nonvolatile memory devices, nonvolatile memory devices and systems incorporating same. More particularly, the disclosure relates to methods of adjusting the nature and timing of control signals applied to nonvolatile memory cell(s) during various read operations.

Nonvolatile memory devices and memory systems incorporating same have become design mainstays within contemporary electronic devices and digital data systems. There are many different types of nonvolatile memory, including the Electrically Erasable Programmable Read Only Memory (EEPROM). So-called "flash memory" is one type of EEPROM and is widely used since it is not only allows random programmability like a Random Access Memory (RAM), but also the ability to retain stored data in the absence of applied power like a Read Only Memory (ROM). As a result of these qualities, flash memory is now widely used as data storage media, particularly in portable electronic devices such as laptop and notepad computers, digital cameras, personal digital assistants (PDAs), and MP3 players.

SUMMARY OF THE INVENTION

Certain embodiments of the inventive concept provide a method of operating a non-volatile memory device, comprising; during a read operation directed to a nonvolatile memory cell having a positive threshold voltage and being connected between a selected word line and a selected bit line, applying a positive read voltage to the selected word line and a first control signal to a page buffer connected to the selected bit line, and during a read operation directed to the memory cell having a negative threshold voltage, applying a negative read voltage to the selected word line and a second control signal to the page buffer different from the first control signal.

In a related aspect, the second control signal causes relatively more electrical charge to be accumulated or retained on the selected bit line than the first control signal.

In another related aspect, the first control signal defines a first read operation interval comprising a first discharge interval, a first pre-charge interval, a first developing interval, and a first sensing interval, and the second control signal defines a second read operation interval comprising a second discharge interval, a second pre-charge interval, a second developing interval, and a second sensing interval.

In another related aspect, the second read operation interval is longer in duration than the first read operation interval.

In another related aspect, the second pre-charge interval is longer in duration than the first pre-charge interval.

In another related aspect, the second read operation interval is longer in duration than the first read operation interval.

In another related aspect, the second pre-charge interval begins relatively sooner in the second read operation interval than the first pre-charge interval begins in the first read operation interval.

In another related aspect, the second developing interval begins relatively later in the second read operation interval than the first developing interval begins in the first read operation interval.

In another related aspect, application of the positive read voltage and application of the negative read voltage to the selected word line are symmetrical over at least a portion of the read operation interval and with respect to an initial word line voltage.

In another related aspect, application of the positive read voltage and application of the negative read voltage to the selected word line are asymmetrical over a at least a portion of the read operation interval and with respect to an initial word line voltage.

In another related aspect, the negative read voltage is applied to the selected word line over a longer portion of the read operation interval than the positive read voltage.

In another related aspect, the negative read voltage is applied to the selected word line in relation to a negative target voltage with a different voltage slope characteristic than the positive read voltage is applied to the selected word line in relation to a positive target voltage.

In another related aspect, a voltage slope characteristic for the negative read voltage is steeper towards the negative target voltage than a voltage slope characteristic for the positive read voltage is towards the positive target voltage.

In another related aspect, an absolute value of a positive difference between the initial word line voltage and a positive target voltage associated with the positive read voltage is less than an absolute value of a negative difference between the initial word line voltage and a negative target voltage associated with the negative read voltage.

In another related aspect, the read operation is a program-read-verify operation, or an erase-read-verify operation.

In another related aspect, the nonvolatile memory cell is a multi-level memory cell (MLC).

In another related aspect, the nonvolatile memory cell is a NAND type flash memory cell.

In another embodiment, the inventive concept provides a method of operating a non-volatile memory device, comprising; during a read operation directed to a memory cell connected between a selected word line and a selected bit line and applying a positive read voltage to the selected word line, applying a bit line voltage to the selected bit line at a first time relative to a time at which the positive read voltage is applied to the selected word line, and during a read operation directed to the memory cell and applying a negative read voltage to the selected word line, applying the bit line voltage to the selected bit line at a second time later than the first time, such that application of the bit line voltage occurs during an interval wherein the negative read voltage is transitioning from an initial word line voltage to a negative target voltage.

In another related aspect, the memory cell has a threshold voltage between the negative target voltage and the negative read voltage such that an ON period for the memory cell following application of the negative read voltage is reduced.

In yet another embodiment, the inventive concept provides a method of reading data stored in a non-volatile memory cell according to a defined threshold voltage distribution, the memory cell being connected between a selected word line and a selected bit line and the method comprising; determining whether the threshold voltage distribution is positive or negative, if the threshold voltage distribution is positive, applying a positive read voltage to the selected word line during a first read operation interval including a first discharge interval, a first pre-charge interval, a first developing interval, and a first sensing interval, and if the threshold voltage is negative, applying a negative read voltage to the selected word line during a second read operation interval different from the first read operation interval and including a second discharge interval, a second pre-charge interval, a second developing interval, and a second sensing interval.

In another related aspect, the second pre-charge interval is longer than the first pre-charge interval.

In another related aspect, the method further comprises; generating a first control signal defining the first read operation interval if the threshold voltage distribution is positive, and generating a second control signal defining the second read operation interval if the threshold voltage distribution is negative.

In yet another embodiment, the inventive concept provides a nonvolatile memory device comprising; a nonvolatile memory cell, and operation control circuitry comprising control logic configured to apply either a positive read voltage or a negative read voltage to a selected word line connected to the nonvolatile memory cell, and further configured to adjust timing of a read operation interval for a read operation determining a data state for the nonvolatile memory cell based on whether the positive read voltage or the negative read voltage is applied to the selected word line.

In a related aspect, the read operation is a program-read-verify operation of an erase-read-verify operation.

In another related aspect, the control logic is further configured to control generation of either the positive read voltage or negative read voltage, and generation of either a first control signal defining a first read operation interval during which the positive read voltage is applied to the selected word line or a second control signal defining a second read operation interval during which the negative read voltage is applied to the selected word line.

In another related aspect, the first and second read operation intervals respective comprise a discharge interval, a pre-charge interval, a developing interval, and a sensing interval.

In another related aspect, the second read operation interval is longer in duration than the first read operation interval.

In another related aspect, the pre-charge interval of the second read operation interval is longer in duration than a pre-charge interval of the first read operation interval.

In another related aspect, the operation control circuitry comprises; a voltage generator configured to generate the positive read voltage and the negative read voltage under the control of the control logic, and a page register and sense amplifier block configured to define the first read operation interval in response to the first control signal and the second read operation interval in response to the second control signal.

In another embodiment, the invention provides a nonvolatile memory device comprising; a nonvolatile memory cell, and operation control circuitry configured to apply a positive read voltage to a selected word line connected to the nonvolatile memory cell if the nonvolatile memory cell has a positive threshold voltage, and apply a negative read voltage to the selected word line if the nonvolatile memory cell has a negative threshold voltage, wherein the positive read voltage and negative read voltage are applied asymmetrical over a portion of a read operation interval and with respect to an initial word line voltage of the selected word line.

In a related aspect, the negative read voltage is applied to the selected word line over a longer portion of the read operation interval than the positive read voltage.

In another related aspect, the negative read voltage is applied to the selected word line in relation to a negative target voltage with a different voltage slope characteristic than the positive read voltage applied to the selected word line in relation to a positive target voltage.

In another embodiment, the invention provides a memory card comprising; a card interface, and a controller configured to control an exchange of data between the card interface and the nonvolatile memory device as described above.

In another embodiment, the invention provides a memory system comprising; the nonvolatile memory device described above and a controller configured to control operation of the nonvolatile memory device. In one aspect, the nonvolatile memory device and controller may be configured to collectively operate as a solid state drive (SSD).

BRIEF DESCRIPTION OF THE DRAWINGS

Certain embodiments of the inventive concept are illustrated in relevant portion in the attached drawings, in which.

DETAILED DESCRIPTION

Reference will now be made in some additional detail to embodiments of the inventive concept as illustrated in the accompanying drawings. It should be noted, however, that the inventive concept may be variously embodied and should not be construed as being limited to only the illustrated embodiments. Throughout the drawings and the written description, like reference numbers and labels are used to indicate like or similar elements.

Figure 1:
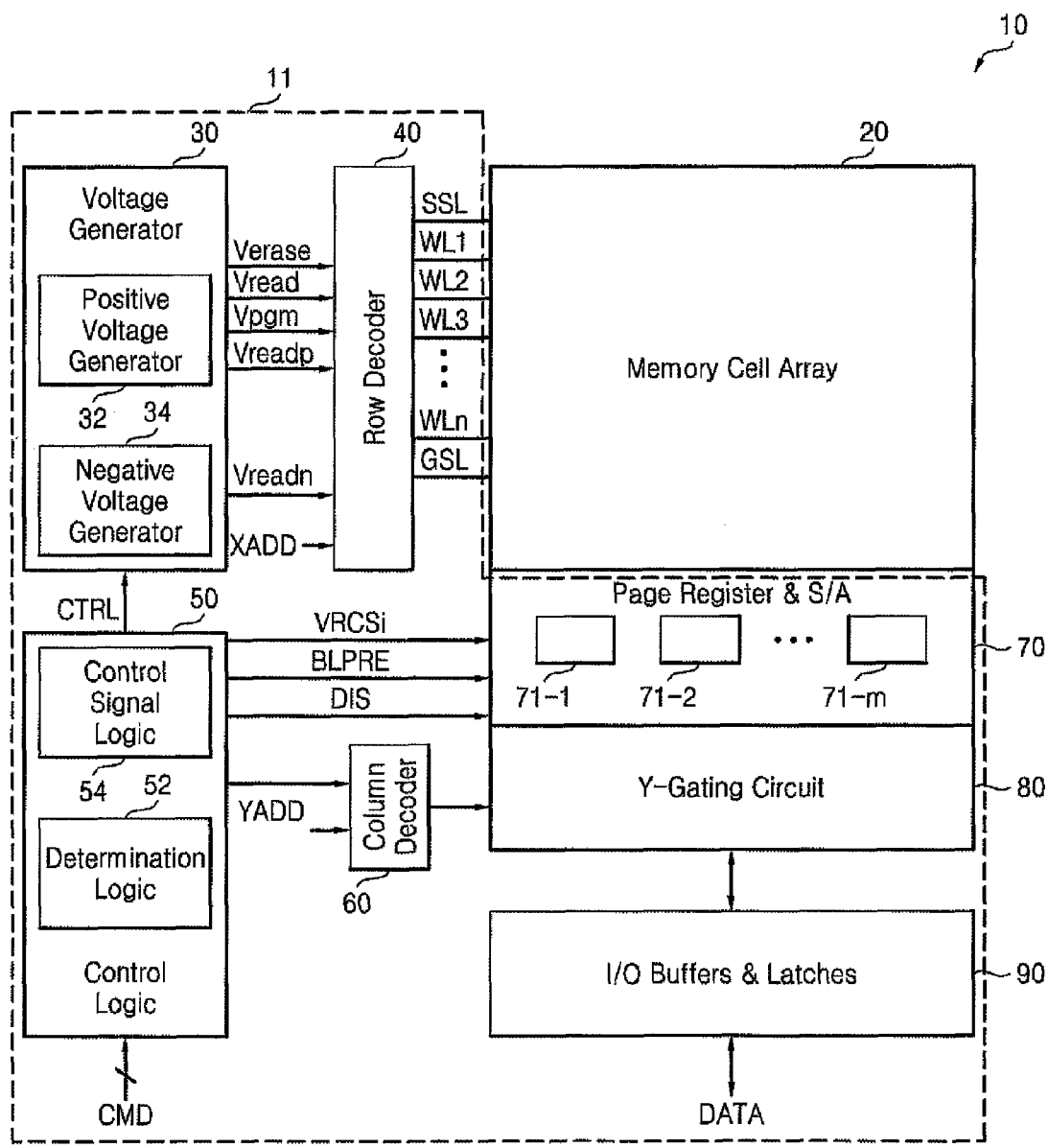
FIG. 1 is block diagram in relevant portion of a nonvolatile memory device according to embodiments of the inventive concept.
Figure 2:
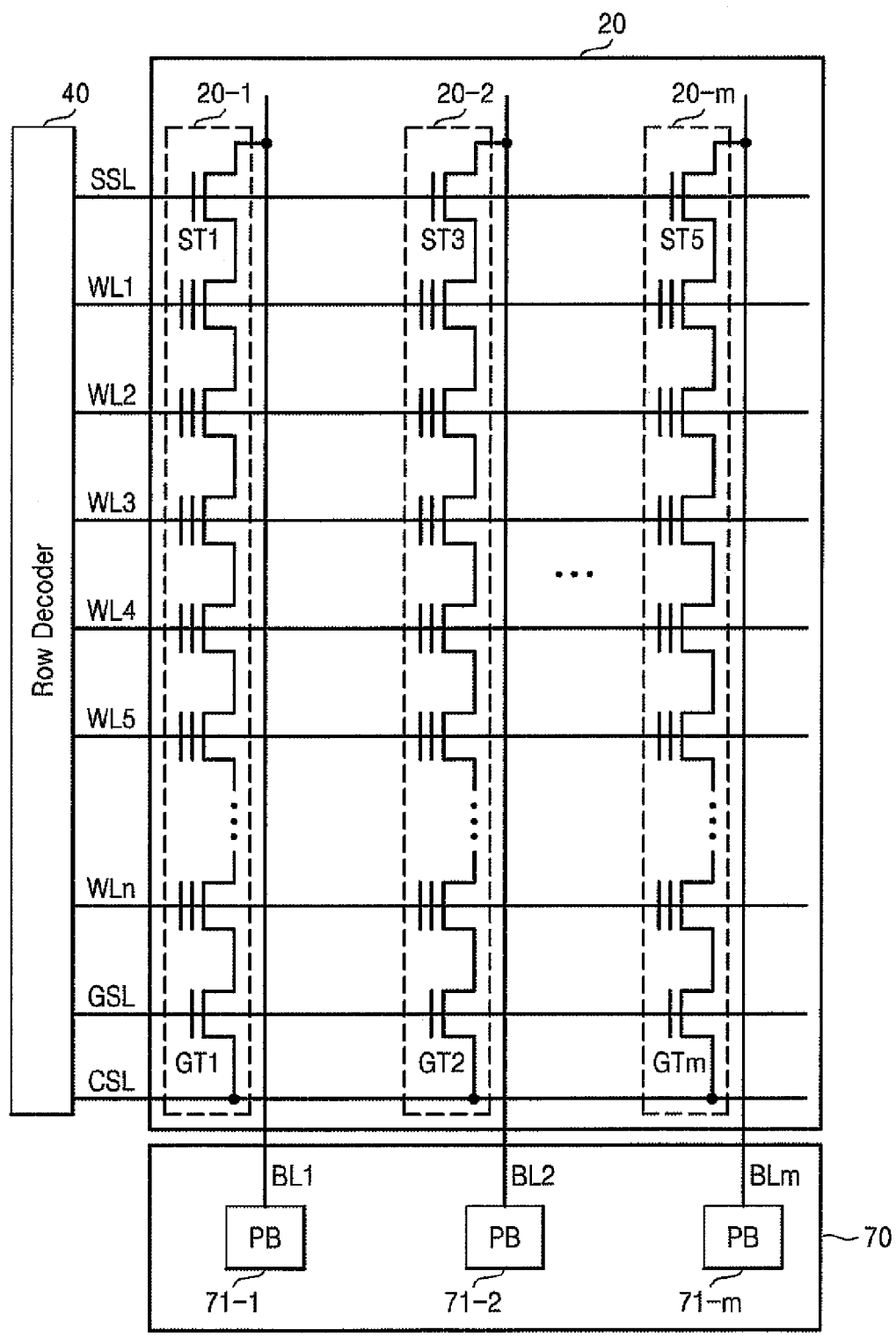
FIG. 2 further illustrates the memory cell array of FIG. 1 as a two dimensional memory cell array.
Figure 3:
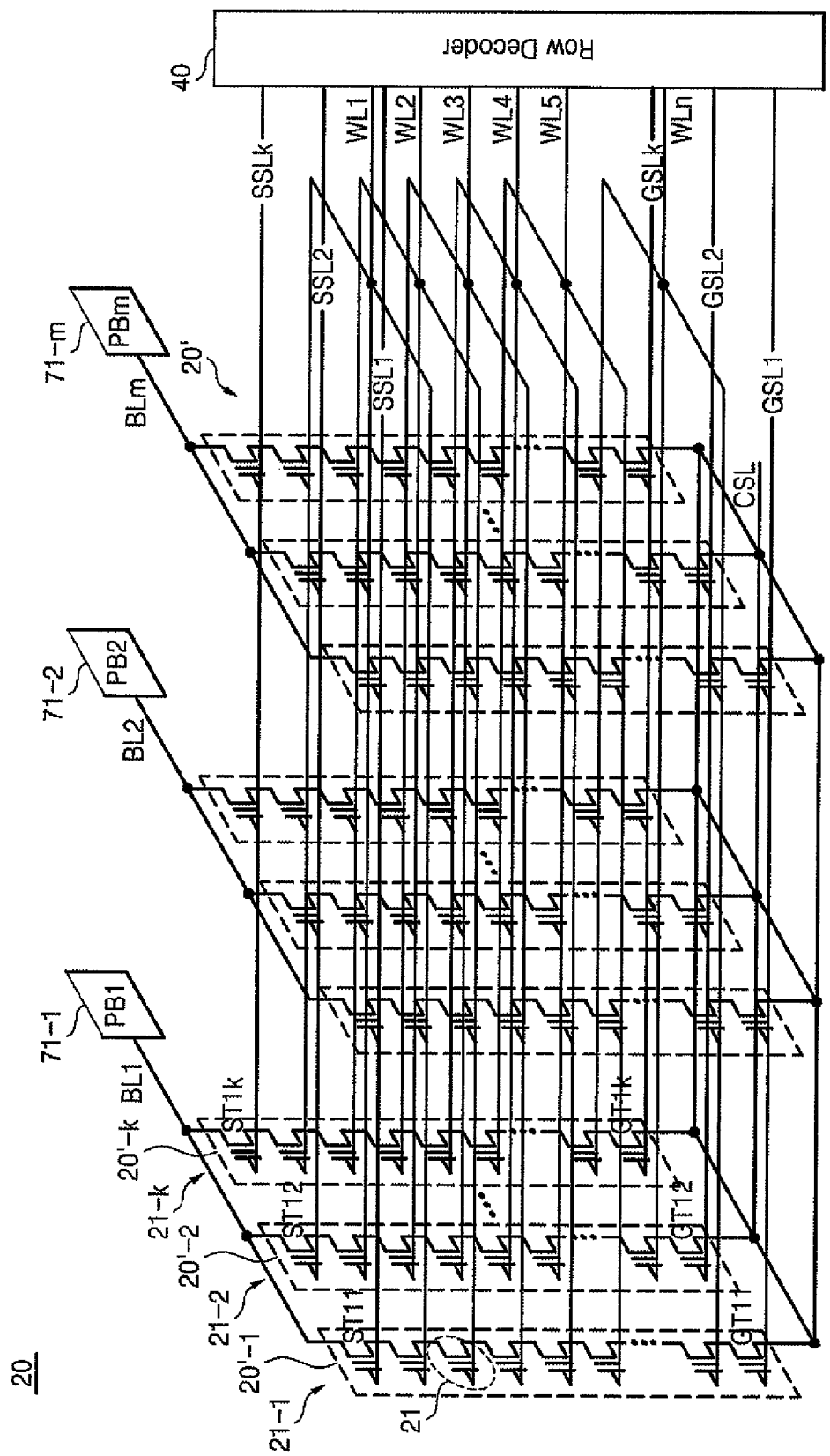
FIG. 3 further illustrates the memory cell array of FIG. 1 as a three dimensional memory cell array.

FIG. 1 is a partial block diagram illustrating relevant portions of a nonvolatile memory device according to an embodiment of the inventive concept. FIGS. 2 and 3 further illustrate the memory cell array of the nonvolatile memory system of FIG. 1. Of note, the illustrated embodiments of the inventive concept assume a NAND type flash memory device as a teaching context. Those skilled in the art will recognize, however, that other types of nonvolatile memory cells may be incorporated within constituent memory cell arrays of embodiments of the inventive concept.

In FIG. 1, a nonvolatile memory device 10 generally comprises an operation control circuitry 11 and a memory cell array 20 in which a plurality of nonvolatile memory cells are arranged. In general layout and disposition, the operation control circuitry 11 is well understood by those skilled in the art, but the operative arrangement and control scheme(s) afforded by embodiments of the inventive concept are novel and nonobvious. Operation control circuitry 11 comprises in relevant portion; a voltage generator 30, a row decoder 40, control logic 50, a column decoder 60, a page register & sense amplifier (S/A) block 70, a Y-gating block 80, and an input/output (I/O) buffer & latch block 90.

With reference to FIGS. 1, 2 and 3, the memory cell array 20 is assumed to be a NAND type memory cell array arranged in a plurality of cell strings 20-1, 20-2, ... 20-$m$. Each one of the plurality of cell strings 20-1, 20-2, ... 20-$m$ conventionally comprises a plurality of NAND flash memory cells sequentially arranged along a corresponding bit line BL1, BL2 ... BL$m$ extending between respective string selection transistors ST1, ST2 ... ST$m$ and ground selection transistors GT1, GT2, ... GT$m$. Each bit line BL1, BL2, ... BL$m$ is respectively connected to a corresponding page buffer (PB) 71-1, 71-2, ... 71-$m$ disposed in the I/O buffer & latch block 90. Those skilled in the art will recognize that other bit line to page buffer connection schemes might alternately be used.

The collection of string selection transistors ST1, ST2 ... ST$m$ and ground selection transistors GT1, GT2, ... GT$m$ are respectively controlled by control signals applied through the row decoder 40 via at least one string selection line SSL and at least one ground selection line GSL. The NAND flash memory cells are arranged in parallel rows, each row being connected to and controlled by a corresponding word line WL1, WL2, ... WL$n$. For example, each row of memory cells may be selected or non-selected by application of appropriate word line control voltages provided through the row decoder 40. At least one common source line (CSL) traverses the memory cell array 20 to terminate each ground selection transistor GT1, GT2, ... GT$m$.

As further illustrated in FIG. 3, the memory cell array 20 may be arranged as a stacked, three-dimensional (3D) structure to further enhance memory cell integration density. That is, each memory cell string 20-1, 20-2, ... 20-$m$ may be arranged in a two dimensional layer, and a plurality of such layers may be stacked to form the 3D structure, such as the one partially illustrated in FIG. 3. In FIG. 3, for example, a first cell string 20'-1 may be arranged on a first layer 21-1, a second cell string 20'-2 may be arranged on a second layer 21-2, and so on through a kth cell string 20'-$k$ arranged in a kth layer 21-$k$.

Embodiments of the inventive concept contemplate the use of memory cell arrays including nonvolatile memory cells configured to store a single bit of data (so-called, single level memory cells—SLCs) and/or nonvolatile memory cells configured to store two or more bits of data (so-called, multi-level memory cells—MLCs). Accordingly, each one of the plurality of memory cell strings 20-1, 20-2, ... 20-$m$ shown in FIGS. 2 and 3 may include NAND flash SLCs and/or NAND flash MLCs.

Returning to FIG. 3, the memory cell array 20, row decoder 40, and page buffers 71-1, 71-2 ... 71-$m$ may also be disposed in the 3D structure. As part of this arrangement, the first cell string 20'-1 disposed in the first layer 21-1 comprises a plurality of NAND flash memory cells serially connected between string selection transistor ST11 and ground selection transistor GT11. The second cell string 20'-2 disposed in the second layer 21-2 comprises a plurality of NAND flash memory cells serially connected between string selection transistor ST12 and ground selection transistor GT12, and so on though the kth cell string 20'-$k$ disposed in the kth layer 21-$k$ and comprising a plurality NAND flash memory cells serially connected between string selection transistor ST1$k$ and ground selection transistor GT1$k$.

The row decoder 40 illustrated in FIG. 3 may be configured to supply a plurality string selection signals, such as (e.g.) a read voltage Vread during a read operation, a power voltage Vcc during a program operation, and a ground voltage 0V during an erase operation via the string selection lines SSL1, SSL2, ... SSL$k$ respectively connected to the gates of string selection transistors ST11, ST12, ... ST1$k$ disposed in layers 21-1, 21-2, ... 21-$k$. In this manner, each one of the string selection transistors ST11, ST12, ... ST1$k$ may selectively be turned ON/OFF.

The row decoder 40 may be further configured to supply a plurality of ground selection signals, such as (e.g.) a read voltage Vread during a read operation, or a ground voltage 0V during a program operation and an erase operation via ground selection lines GSL1, GSL2, ... GSL$k$ respectively connected to gates of ground selection transistors GT11, GT12, ... GT1$k$ disposed in layer 21-1, 21-2 ... 21-$k$. In this manner, each one of the ground selection transistors GT11, GT12, ... GT1$k$ may be selectively turned ON/OFF.

As further illustrated in FIG. 3, each memory cell string 20'-1, 20'-2, ... 20'-$k$ arranged respectively along one of the plurality of bit lines BL1, BL2, ... BL$m$ may share the plurality of word lines WL1 to WLn and at least one common source line CSL. Further, each cell string 20'-1, 20'-2, ... 20'-k disposed in a corresponding one of layers 21-1, 21-2, ... 21-k is connected to a page buffer 71-1, 71-2, ..., 71-m disposed within the page register & sense amplifier block 70.

The nonvolatile memory device 10 of FIG. 1 and the memory cells array 20 further illustrated in FIGS. 2 and 3 are described herein to provide a definitive but exemplary teaching context and to teach the making and use of certain embodiments of the inventive concept. A specific working example will be assumed wherein a nonvolatile memory cell 21 disposed in the first cell string 20'-1 of the first layer 21-1 among the plurality of layers 21-1 to 21-k of the 3D memory cell array 20 is selected by the row decoder 40. In the exemplary, operative arrangement illustrated in FIG. 1, the components of the operation control circuitry 11 cooperate to collectively control the execution of program, read and erase operations directed to one more selected memory cell(s) in the memory cell array 20, such as nonvolatile memory cell 21.

The voltage generator 30 is configured to generate and provide a number of control voltages selectively applied to the memory cell array 20 primarily through the row decoder 40. For example, certain "high" voltages (e.g., one or more voltages having a level greater than a power supply voltage provided to the voltage generator 30) may be generated by the voltage generator 30 in response to various control signals CTRL received from the control logic 50. Within certain embodiments of the inventive concept, the voltage generator 30 may comprise a positive control voltage generator 32 and a negative control voltage generator 34. In this manner, the voltage generator 30 may generate and provide to row decoder 40 such control voltages as an erase voltage (Verase), a read voltage (Vread), a program voltage (Vpgm), a positive read voltage (Vreadp), a negative read voltage (Vreadn), etc. These control voltages, among other control signals understood by those skilled in the art, may be selectively connected through row decoder 40 to the word lines WL1 to WLn traversing the memory cell array 20 in accordance with an externally provided row address signal XADD.

Control logic 50 generally controls the operation of voltage generator 30, row decoder 40, column decoder 60, page register & sense amplifier block 70, Y-gating block 80, and I/O buffer & latch block 90. Various control signals CTRL, like those applied to voltage generator 30, may be similarly applied to other components of the operation control circuitry 11. In this regard, the control logic 50 may generally comprise determination logic 52 and control signal logic 54 that cooperate to generate and provide the control signals. A more particular description of exemplary control signals provided by the control logic 50 will be described hereafter in relation to certain embodiments of the inventive concept.

As is generally understood by those skilled in the art, the column decoder 60 is responsive to an externally provided column address YADD to control the operation of the Y-gating block 80. Together with the row decoder 40, page register and sense amplifier block 70 and I/O buffers and latch block 90, the Y-gating block 60 enables "read data" retrieved from the memory cell array 20 to be communicated to external circuits, and further enables "program data" to be programmed to the memory cell array 20 to be written to designated memory cells in the memory cell array 20.

As noted above and as is understood by those skilled in the art, various operations may be directed to the memory cell array 20 in response to externally generated commands (CMD) Such commands are typically applied to the control logic 50 and may include row/column addresses, program data, control signals, etc. A number of these operations are respectively and interchangeably referred to as a "read operation." For example, when stored data is retrieved from the memory cell array 20, a "data read operation" is performed. Additionally, when the data state of memory cell(s) being programmed or erased are checked or "verified" as part of a program operation or an erase operation, a "read-verify operation" is performed. Hence, there are generally two types of read-verify operations; a "program-read-verify operation" performed as part of a program operation, and an "erase-read-verify operation" performed as part of an erase operation. The term "read operation" as generally used hereafter subsumes and respectively includes each one of these more particular read-type operations. Thus, a read operation may be understood as any operation determining the threshold voltage (and/or a corresponding data state) for one or more memory cells in the memory cell array 20. During program and erase operations, the program-read-verify operation and erase-read-verify operation are respectively used to determine whether a memory cell threshold voltage currently resides in a defined target threshold voltage distribution (i.e., a range of threshold voltages indicating an intended program state or an intended erase state).

Regardless of the exact nature or functional intent of a particular read operation, it will be performed within embodiments of the inventive concept by applying defined control voltages to selected word line(s) and/or bit line(s) associated with one or more nonvolatile memory cell(s). Accordingly, under the control of control logic 50 and in response to an externally and/or internally generated command(s), the operation control circuitry 11, and primarily the voltage generator 30, will generate various control voltages in response to control signals to cause the execution of the read operation. For example, in certain embodiments of the inventive concept, the control logic 50 generates a read operation "control signal" VRCSi and provides the control signal VRCSi to other components (e.g., the page register and sense amplifier block 70) within the operation control circuitry 11. The control signal VRCSi effectively defines the constituent nature and timing of a so-called "read operation interval" during which the read operation is executed. For example, if the read-verify operation is being performed in relation to a positive verification voltage (i.e., a positive voltage indicative of a corresponding target threshold distribution), the control logic 50 may cause the generation and application of a positive program-read-verify voltage (Vreadp). Alternately, if the read-verify operation is being performed in relation to a negative verification voltage (i.e., a negative voltage indicative of a corresponding target threshold distribution), the control logic 50 may cause the generation and application of a negative program-read-verify voltage (Vreadn). Under the foregoing conditions, either the positive program-read-verify voltage Vreadp, or the negative program-read-verify voltage Vreadn may be applied to at least one word line connected to selected nonvolatile memory cell(s) from among the plurality of word lines WL1 to WLn during a program-read-verify operation. In this regard, the positive program-read-verify voltage and the negative program-read-verify voltage are respective examples of various positive read voltages (Vreadp) and negative read voltages (Vreadn) that might be generated during read operations other than the program-read-verify operation.

In the foregoing context, the term "positive" should be construed as any voltage level greater than 0V and the term "negative should be construed as any voltage less than 0V. Of further note, a negative verification (or target) voltage may indicate a "negative" threshold voltage distribution, despite the fact that a portion of the threshold voltage distribution is equal to or greater than 0V.

Figure 4:
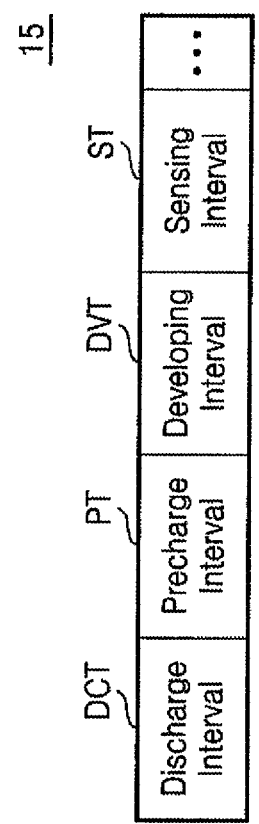
FIG. 4 conceptually illustrates the constituent intervals of a read operation interval as controlled by certain control signals provided by the control logic of FIG. 1.

The operation control logic 50 within certain embodiments of the inventive concept may cause not only the generation of various read voltages (e.g., Vreadp and Vreadn), but also other control voltages and control signals causing the execution of a current read operation. For example, the read operation control signal VRCSi may be used to define the nature and timing of control voltages and control signals over intervals (or sub-intervals) of a read operation interval. Consider, for example, the read operation interval 15 generally illustrated in FIG. 4. Assuming an exemplary read operation, the corresponding read operation interval 15 illustrated in FIG. 4 comprises; a discharge interval DCT defining a discharge period for a bit line connected to a selected memory cell string, a pre-charge interval PT defining a pre-charge period for the bit line, a developing interval DVT defining a development period for the bit line, and a sensing interval ST defining a sensing period for the bit line. Those skilled in the art will recognize that other or additional interval (or sub-interval) types may be included within a read operation interval consistent with a particular memory system design and its method of operation.

Conventionally, the respective duration(s) of the sequentially executed intervals forming a particular read operation interval (or program operation interval, or erase operation interval) are fixed as a function of manufacturers pre-set, and/or memory system initialization. However, a read operation control signal VRCSi consistent with embodiments of the inventive concept is able to adaptively adjust (or vary) the duration of one or more of the intervals forming the read operation interval as a function of memory system conditions. This adaptive adjustment function will be further explained hereafter. In similar manner, the operational timing and duration of intervals during a program operation interval or an erase operation interval may be adjusted within embodiments of the inventive concept using one or more program (or erase) control signal(s) generated by the operation control circuitry 11.

Thus, the operation control circuitry 11 according to embodiments of the inventive concept may generate an erase control signal VRCSi capable of controlling the timing of an erase-read-verify operation used to determine whether or not a nonvolatile memory cell has been properly erased in relation to a (negative/positive) erase-read-verify voltage (Vreadn/Vreadp) applied to a word line connected to a selected nonvolatile memory cell from among a plurality of word lines WL1 to WLn during an erase-read-verify operation.

From the foregoing example, those skilled in the art will recognize that the terms "positive read voltage" (Vreadp) and "negative read voltage" (Vreadn) will be used to generally describe read voltages that may be applied to word lines of selected nonvolatile memory cells during all types of read operations. Similarly, the use and nature of the read operation control signal VRCSi described above may be readily extrapolated to understand analogous erase operation control signals and program operation control signals.

Returning to FIG. 4, it should be noted that the control signal VRCSi generated by the control logic 50 is usually applied in an iterative manner (i.e., per operational interval) over a sequence of "n" intervals, where "i" varies from 1 to n. In certain embodiments of the inventive concept, the operation control circuitry 11 operates to generate one or more control signal(s) capable of adjusting the timing of a read operation interval (i.e., the duration of the respective intervals forming the read operation interval and/or the duration of the entire read operation interval). Such adjustment may be made on an operational interval "i", per operational interval "i+1" basis. For example, the duration of at least one of the discharge interval DCT, the pre-charge interval PT, the developing interval DVT and the sense interval ST forming a read operation may be increased or decreased during a particular read operation interval "i" in accordance with one or more applied control signal(s) (e.g., VRCSi).

Extending this working example, the operation the voltage generator 30, row decoder 40, column decoder 60, page register & sense amplifier block 70, and a Y-gating block 80 in response to the control logic 50 will be further described.

During a read operation, the voltage generator 30 generates at least one of the positive read voltage Vreadp and the negative read voltage Vreadn according to the control signals CTRL provided by the control logic 50. In accordance with the externally provided row address XADD, the row decoder 40 applies either the positive read voltage Vreadp or the negative read voltage Vreadp to a selected word line from among the plurality of word lines WL1 to WLn as a control voltage, (e.g., a read operation voltage or a read-verify operation voltage).

The positive read voltage Vreadp or negative read voltage Vreadn may be generated by the voltage generator 30 and applied through the row decoder 40 as part of a collection of control voltages. Thus, the voltage generator 30 might also generates, for example, a program voltage Vpgm necessary for performing a program operation, or an erase voltage Verase necessary for performing an erase operation. In certain embodiments of the inventive concept, the positive voltage generator 32 may be used to generate the positive read voltage Vreadp and the negative voltage generator 34 may be used to generate the negative read voltage Vreadn according to voltage selection information communicated from the control logic 50 by corresponding control signals CTRL.

Particularly relevant portions of the nonvolatile memory device 10 of FIG. 1 are further illustrated in some additional details in FIGS. 5 through 8. The operation of these elements will be further described in the context of an assumed program-read-verify operation directed to the selected nonvolatile memory cell 21 connected to the second word line WL2 among a plurality of word lines WL1 through WLn and disposed in the first memory cell string 20-1 connected to the first bit line BL1. Because the second word line WL2 and the first bit line BL1 are connected to (directly or indirectly) the selected nonvolatile memory cell 21 and are used to communicate respective control voltages, they may be referred to as "selected" word and bit lines.

During the exemplary program-read-verify operation, the row decoder 40 applies either a positive read-verify voltage Vreadp or a negative read-verify voltage Vreadn generated by the voltage generator 30 to the selected word line WL2, and further supplies a (normal) read voltage Vread to the remaining word lines WL1, and WL3 to WLn, the string selection line SSL connected to a gate of the string selection transistor ST1, and the ground selection line GSL connected to a gate of the ground selection transistor GT1. Under these voltage bias conditions, a ground voltage is supplied to the common source line CSL and the semiconductor bulk comprising the plurality of nonvolatile memory cells of the memory cell array 20.

Analogously, during a read operation, the row decoder 40 applies a positive read voltage Vreadp or a negative read voltage Vreadn generated by the voltage generator 30 to the selected word line WL2, and also supplies the read voltage Vread to the remaining word lines WL1, and WL3 to WLn, the string selection line SSL connected to the gate of the string selection transistor ST1, the ground selection line GSL connected to the gate of the ground selection transistor GT1. Under these voltage bias conditions, a ground voltage is supplied to the common source line CSL and semiconductor bulk.

As the result of either the program-read-verify operation or the read operation described above, read data is retrieved from the memory cell array 20 and presented through page buffer 71-1 of the page register and sense amplifier block 70 to the I/O buffers and latch block 90. The control logic 50 then controls the operation of the I/O buffer & latch block 90 in relation to the externally provided command CMD and corresponding control signals received from the control logic 50.

In addition to the control signal VRCSi, the control logic 50 also generates voltage selection information in accordance with a defined read operation sequence. For example, the control logic 50 may respectively generate a discharge control signal DIS controlling a bit line discharge operation, and a pre-charge enable signal BLPRE controlling a bit line pre-charge operation within the page register & sense amplifier block 70. That is, the determination logic 52 of the control logic 50 may generate voltage selection information (as communicated to the voltage generator 30 and the control signal logic 54 via various control signals CTRL) in accordance with the read operation sequence. Within various embodiments of the inventive concept, the control logic 50, the determination logic 52, and/or the control signal logic 54 may be implemented in hardware, firmware and/or software. In certain embodiments, the determination logic 52 of the control logic 50 may be implemented as a state machine.

The control signal logic 54 of the control logic 50 may be used to generate the control signal VRCSi applied to at least the page register and sense amplifier block 70 to define (or adjust) the timing of the read operation interval in accordance with the voltage selection information provided by the determination logic 52. In this regard, the control signal logic 54 of the control logic 50 may be used to adjust an active period for the pre-charge enable signal BLPRE, (e.g., the logically low period of the pre-charge enable signal BLPRE shown in FIGS. 9 and 10), as applied to the page register & sense amplifier block 70.

The page register & sense amplifier block 70 comprises various circuitry capable of performing the bit line pre-charge function (i.e., a pre-charge voltage supply circuit) by controlling at least one of the start time at which a pre-charge voltage is applied to the selected bit line and a cut-off time at which the pre-charge voltage is cut off in response to the control signal VRCSi. In certain embodiments of the inventive concept, the start time may be controlled by adjusting the timing and/or duration of the discharge interval DCT while the cut off time may be adjusted by controlling the timing and/or duration of the developing interval DVT. (See, FIG. 4).

Figure 5:
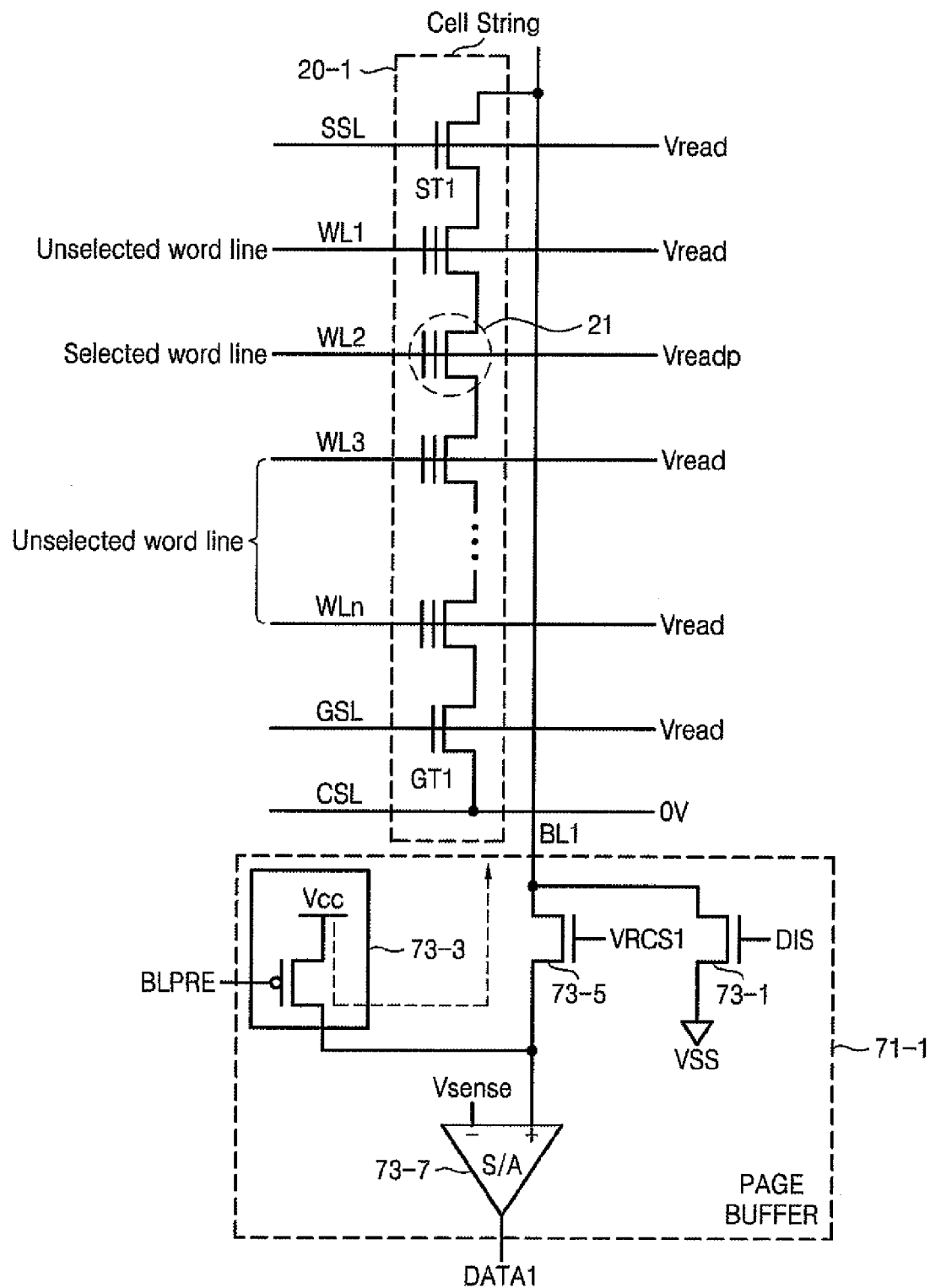
FIG. 5 is a partial circuit diagram further illustrating a bit line pre-charge scheme for a bit line associated with selected nonvolatile memory cell, wherein a positive read voltage is applied to the selected word line during a read operation.
Figure 6:
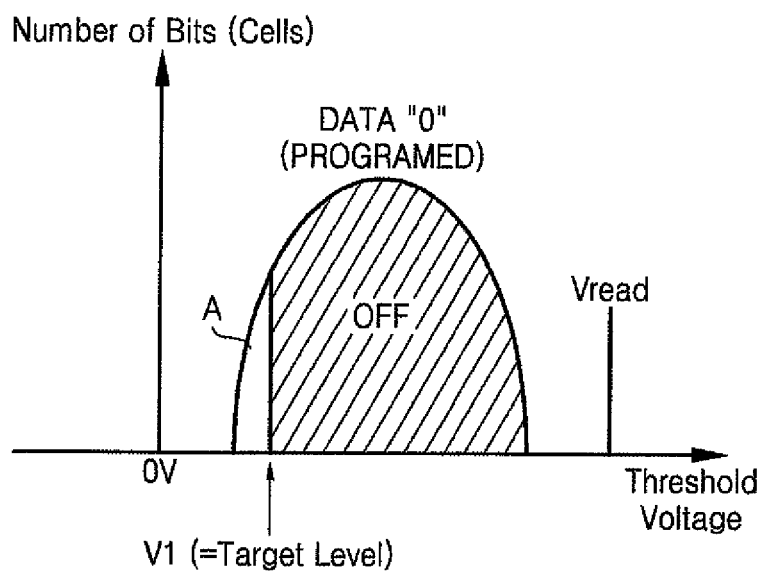
FIG. 6 illustrates a threshold voltage distribution for the nonvolatile memory cell of FIG. 5 having a positive program-read-verify voltage applied to the selected word line.
Figure 9:
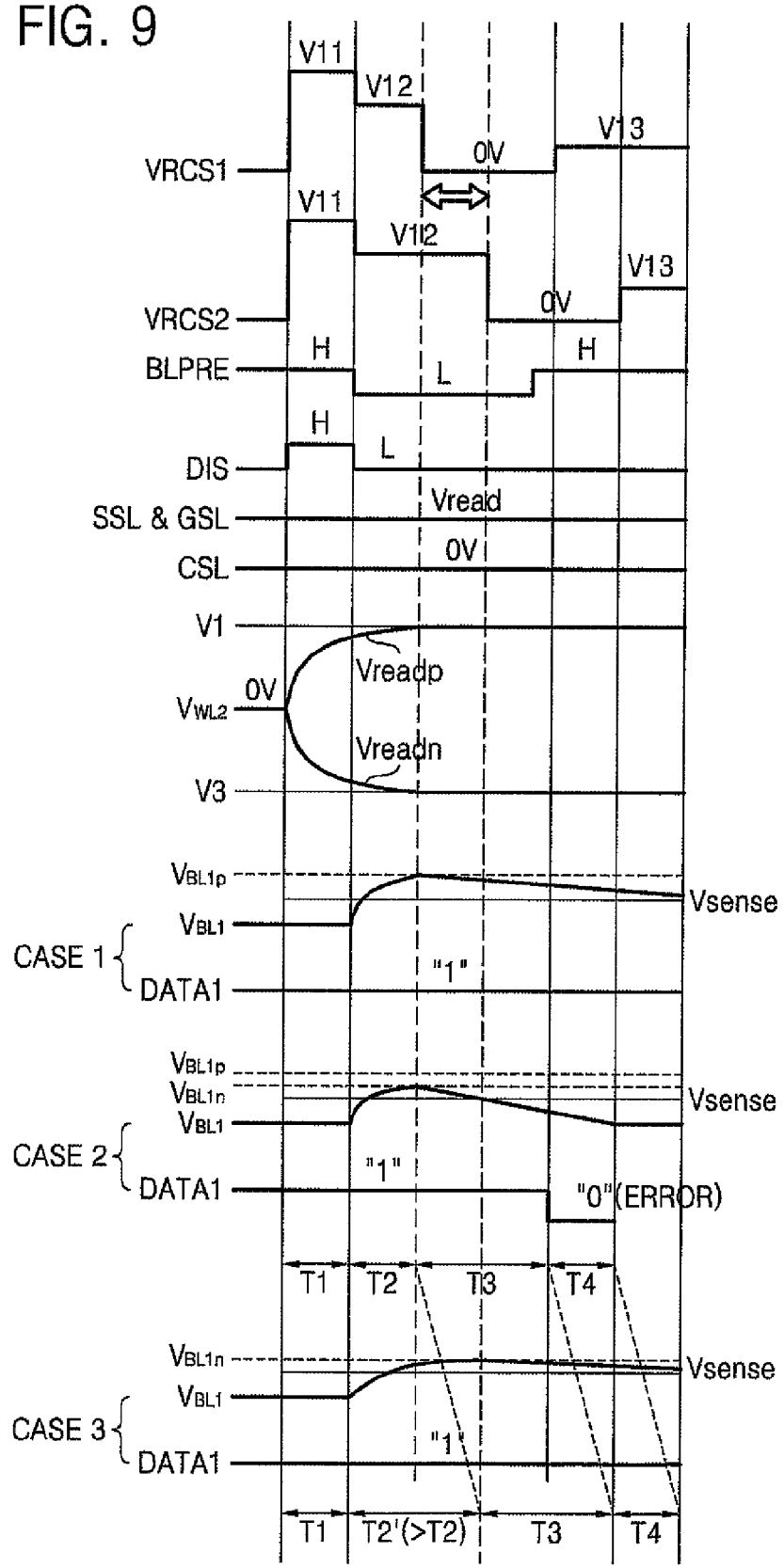
FIG. 9 is a related set of waveform diagrams for selected control signals, control voltages, and response defining a read operation executed within the nonvolatile memory device of FIG. 1.

FIG. 5 is a partial circuit diagram more specifically illustrating control voltage bias conditions applied to the memory cell string 21-1 including the selected memory cell 21 cell during a bit line pre-charge scheme, wherein a positive read voltage Vreadp is applied to the selected word line WL2 during a read operation. FIG. 6 illustrates a positive target threshold voltage distribution associated with a programmed data state (e.g., a logical "0" or OFF-cell) for the selected memory cell 21. FIG. 9 is a related waveform diagram further illustrating applied control voltages and corresponding responses consistent with three (3) working examples (CASE1, CASE2, CASE 3).

Referring collectively to FIGS. 1, 4, 5, 6 and 9, an exemplary program-read-verify operation for the nonvolatile memory device 10 will be described assuming a positive program-read-verify voltage Vreadp is applied to the selected word line WL2.

Figure 7:
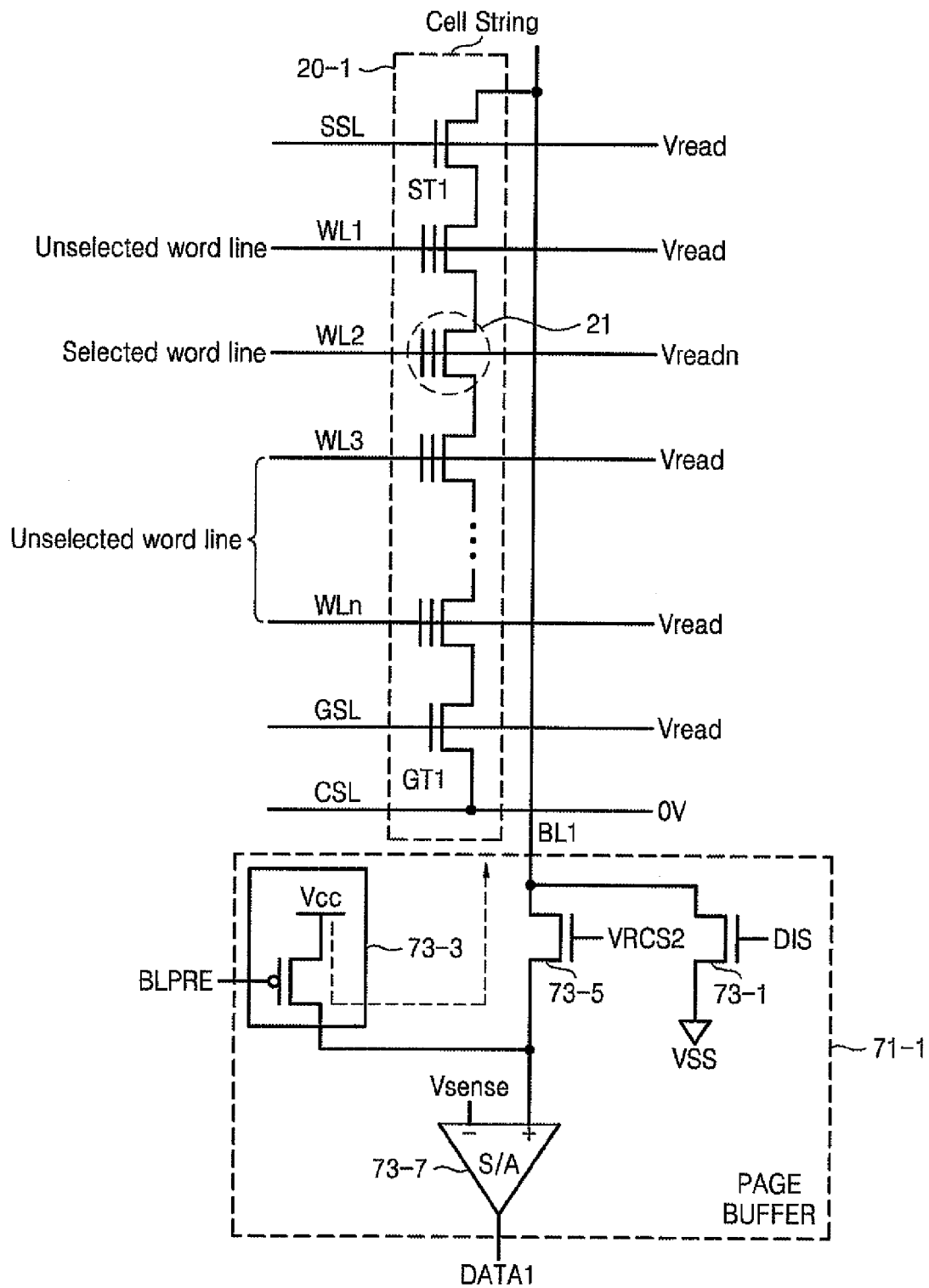
FIG. 7 is a partial circuit diagram further illustrating a bit line pre-charge scheme for a bit line associated with selected nonvolatile memory cell, wherein a negative read voltage is applied to the selected word line during a read operation.
Figure 8:
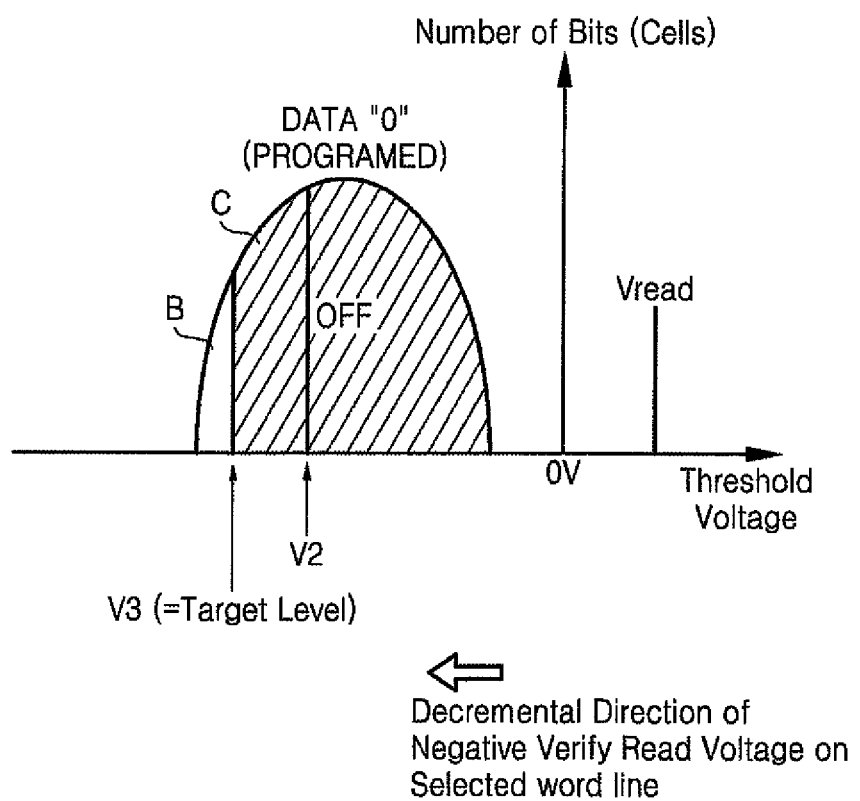
FIG. 8 illustrates a threshold voltage distribution for the nonvolatile memory cell of FIG. 7 having a negative program-read-verify voltage applied to the selected word line.

In contrast to the voltage bias conditions illustrated in FIG. 5, the partial circuit diagram of FIG. 7 illustrates voltage bias conditions applied to the memory cell string 21-1 including the selected nonvolatile memory cell 21 during a bit line pre-charge scheme that applies a negative read voltage to the selected word line WL2 during a read operation. FIG. 8 illustrates a negative target threshold voltage distribution associated with a programmed data state (e.g., a logical "0" or OFF-cell) for the selected memory cell 21.

Referring collectively to FIGS. 1, 4, 7, 8, and 9, an exemplary program-read-verify operation for the nonvolatile memory device 10 of FIG. 1 will be described under an assumption that a negative program-read-verify voltage Vreadn is applied to the selected word line WL2 connected to the nonvolatile memory cell 21.

Given this descriptive context, CASE 1 shown in FIG. 9 will be described. Here, it is assumed that the selected nonvolatile memory cell 21 is programmed such that its threshold voltage is slightly higher than a positive target level V1 (FIG. 6) associated with the positive program-read-verify voltage Vreadp. Thus, when the positive program-read-verify voltage Vreadp is applied to the selected word line WL2, the control signal control logic 54 of the control logic 50 also causes the application of a first control signal VRCS1 to switch transistor 73-5, the application of the discharge control signal DIS to discharge transistor 73-1, and the application of the pre-charge enable signal BLPRE to pre-charge transistor 73-3 of page buffer 71-1 shown in FIG. 5.

As a result during a discharge interval (DCT=T1) for discharging the voltage VBL1 from the selected bit line BL1 to ground voltage VSS, the discharge transistor 73-1 discharges the voltage VBL1 from the selected bit line BL1 to ground voltage VSS under the control of the discharge control signal DIS which is logically "high" during the discharge interval (T1). As a result of these conditions, the pre-charge transistor 73-3 is turned OFF in response to the pre-charge enable signal BLPRE which is high, and the switch transistor 73-5 is turned ON in response to the first control signal VRCS1 which has a first (elevated) voltage level V11 during the discharge interval (T1). Accordingly, the voltage VBL1 apparent on the bit line BL1 is initialized to ground voltage VSS.

At a point during the discharge interval (T1), the positive program-read-verify voltage Vreadp is applied to the selected word line WL2, and the (normal) read voltage Vread is applied to non-selected word lines WL1 and WL3 to WLn, as well as the string selection line SSL and ground selection line GSL. The ground voltage VSS (i.e., 0V) is applied to the common source line CSL and the semiconductor bulk.

During the pre-charge interval (PT=T2) for pre-charging the voltage apparent on the selected bit line BL1 with a pre-charge voltage VBL1p, the discharge transistor 73-1 is turned OFF in response to the discharge control signal DIS being logically "low", the pre-charge voltage transistor 73-3—which may be implemented as a PMOSFET is turned ON in response to the pre-charge enable signal BLPRE being low, and the switch transistor 73-5 is turned ON in response to the first control signal VRCS1 transitioning to a second voltage level V12 less than the first voltage level V11. Therefore, during the pre-charge interval (T2), the pre-charge voltage transistor 73-3 will pre-charge the selected bit line BL1 to a pre-charge voltage VBL1p through the switch transistor 73-5. Also during the pre-charge interval (T2), the voltage $V_{WL2}$ applied to the selected word line WL2 reaches the target level V1 associated with the positive program-read-verify voltage Vreadp. Since the positive target level V1 is less than a programmed threshold voltage of the selected nonvolatile memory cell 21, the selected nonvolatile memory cell 21 will be an OFF-cell.

During the developing interval (DVT=T3), the switch transistor 73-5 is turned OFF in response to the first control signal VRCS1 transitioning to a third voltage level, (i.e., ground voltage 0V), less than the second voltage level V12. Since the pre-charge voltage transistor 73-3 and the selected bit line BL1 are electrically isolated under these conditions, the voltage $V_{BL1}$ apparent on the selected bit line BL1 is maintained at a pre-charge voltage level $V_{BL1p}$ or it will drop to ground voltage in accordance with the programmed state of the selected nonvolatile memory cell 21. That is, when the selected nonvolatile memory cell 21 is an OFF-cell, the voltage $V_{BL1}$ apparent on the selected bit line BL1 is maintained at the pre-charge voltage level $V_{BL1p}$, but when the selected nonvolatile memory cell 21 is an ON-cell, however, the voltage $V_{BL1}$ apparent on the selected bit line BL1 will drop to the ground voltage.

Thus, in CASE 1 shown in FIG. 9, since the selected nonvolatile memory cell 21 is an OFF-cell, the voltage $V_{BL1}$ apparent on the selected bit line BL1 is maintained at around the pre-charge voltage $V_{BL1p}$ through the developing interval (T3). As a result during the sense interval (ST=T4), the sense amplifier 73-7 of FIG. 5 will compare the voltage $V_{BL1}$ apparent on the selected bit line BL1 to a reference sense voltage (Vsense) and output data (DATA1—i.e., a programmed data state of "1" having a logically high level) in accordance with the comparison result. Of further note, certain nonvolatile memory cells exhibiting threshold voltages in the tail region "A" shown in FIG. 6 may be moved into the OFF-cell region during subsequent programming operation(s).

CASE 2 shown in FIG. 9 will now be explained. In contrast to CASE 1 previously described, CASE 2 of FIG. 9 assumes that a negative program-read-verify voltage Vreadn are applied to the selected word line WL2.

Of note in CASES 1 and 2, either the positive program-read-verify voltage Vreadp or the negative program-read-verify voltage Vreadn are applied to the selected word line WL2 symmetrically with respect to one another. In this context, the term "symmetrical" means beginning with an initial word line voltage (e.g., 0V in the example of FIG. 9) disposed halfway between a positive target voltage (V1) and a negative target voltage (V3), a positive read Vreadp (of any type) and a negative read voltage Vreadn (of similar type) are applied over a commonly defined time period with a similar voltage slope characteristics. As a result, when graphically viewed in relation to one another and over the defined time period, the positive read Vreadp and negative read voltage Vreadn will extend symmetrically from an axis defined by the initial word line voltage.

In the foregoing context the term "voltage slope characteristic" refers to a change in level of the applied positive/negative read voltage as a function of time. Hence, a voltage slope characteristic may be defined for any reasonably period(s) of time over which the positive read voltage and/or negative read voltage are respectively applied to the selected word line(s). For example, over a given period of time a voltage slope characteristic for the positive read voltage and/or negative read voltage may be linearly or non-linearly (e.g., exponentially) expressed.

Thus, in CASE 2 shown in FIG. 9, the negative program-read-verify voltage Vreadn (which is symmetrically related to the positive program-read-verify voltage Vreadp) is applied to the selected word line WL2 in accordance with the negative target threshold voltage distribution of FIG. 8 as indicated by the negative target voltage V3. Similar to the assumption made in relation to FIG. 6, it is assumed that the selected memory cell 21 has a threshold voltage greater than the negative target voltage V3. It is also assumed that the control signal logic 54 of the control logic 50 provide the first control signal VRCS1, the discharge control signal DIS, and the pre-charge enable signal BLPRE to a page buffer 71-1 as before when the negative program-read-verify voltage Vreadn is applied to the selected word line WL2.

Thus, in CASE 2 during the pre-charge interval T2, when the negative program-read-verify voltage Vreadn is applied to the selected word line WL2, the selected nonvolatile memory cell 21 remains in the ON-cell state until the negative program-read-verify voltage Vreadn reaches the target level V3. Accordingly, electrical charge provided from the pre-charge voltage generator 73-3 to the selected bit line BL1 is discharged to ground through the selected nonvolatile memory cell 21 which is in the ON-cell state. Accordingly, a peak value for the pre-charge voltage $V_{BL1n}$ apparent on the selected bit line BL1 when the negative program-read-verify voltage Vreadn is provided to the selected word line WL2 is less than the pre-charge voltage $V_{BL1p}$ apparent on the selected bit line BL1 when the positive program-read-verify voltage Vreadp is provided to the selected word line WL2. (Compare CASE 1 and CASE 2 of FIG. 9).

As a result, during the pre-charge interval T2 of CASE 2 in FIG. 9, the negative program-read-verify voltage Vreadn is held at the negative target level V3 for a period of time insufficient to ensure that the pre-charge voltage $V_{BL1n}$ apparent on the selected bit line BL1 remains above an established sense voltage Vsense throughout the developing interval T3. Thus, the ON-cell verses OFF-cell state of the selected nonvolatile memory cell 21 in relation to an applied positive read voltage Vreadp or an applied negative read voltage Vreadn may result in different bit line sensing outcomes during the sense interval T4 by sense amplifier 73-7, where the selected memory cell 21 should be read as being similarly programmed. In FIG. 9. this different bit line sensing outcome is illustrated by the comparison of CASE 1 wherein a data value of "1" is output, and CASE 2 wherein a data value of "0" is erroneously output. In the illustrated example of CASE 2, the erroneous output data will cause a program-read-verify operation failure.

Analogous to the example of FIG. 6, it should be noted that certain nonvolatile memory cells having threshold voltages in the tail region B of FIG. 8 may be moved to the OFF-cell region through subsequent programming operation(s).

The foregoing example has illustrated how a read operation executed within a conventional nonvolatile memory device may return either correct data or erroneous read data for a similarly programmed nonvolatile memory cell as a function of whether a positive read voltage Vreadp or a negative read voltage is applied during the constituent read operation. This is clearly an unacceptable outcome.

To address and remedy this unacceptable outcome, embodiments of the inventive concept provide operation control circuitry 11 including control logic 50 that is capable of generating different control signals (e.g., VRCS1/VRSC2) that are respectively applied to components within the operation control circuitry 11 (e.g., the page register and sense amplifier block 70) to compensate for a difference in selected bit line charge accumulation and retention as between the application of a positive read voltage Vreadp and a negative read voltage Vreadn to a selected word line. The unacceptable outcome noted above is made possible under control signal and control voltage conditions that cause the positive read voltage Vreadp and the negative read voltage Vreadn to be applied in a fully symmetrical manner (i.e., applied over a temporally symmetric time period and applied with similar voltage slope characteristics with respect to an initial word line voltage).

In one aspect, embodiments of the inventive concept provide for the generation and provision of at least first and second control signals VRCS1/VRCS2 based on a determination that a positive read voltage Vreadp or a negative read voltage Vreadn will be provided to a selected word line. And based on the applied control signal VRCS1/VRCS2, the timing of a read operation over a corresponding read operation interval may be adaptively adjusted. This read operation timing adjustment may be made, for example, by differently controlling the operation of the page buffers 71-1, 71-2 . . . 71-m in response to different control signals VRCS1/VRVS2.

As suggested by CASE 3 shown in FIG. 9, certain embodiments of the inventive concept will adjust the timing of the read operation interval by essentially extending the overall duration of the read operation interval, or more specifically extending the pre-charge interval (PT=T2) of the read operation interval in response to the second control signal VRCS2 when a negative read voltage is applied to the selected word line. Alternately, the timing or relative timing of the discharge interval (DCT=T1), the developing interval (DVT=T3), and/or the sense interval (ST+T4) may be adjusted in response to various control signals VRCSi provided by the control logic 50.

When comparing the effects of the first control signal VRCS1 and the second control signal VRCS2 in the specific examples (CASE 1, CASE 2 and CASE 3) illustrated in FIG. 9, an extended pre-charge interval T2' in CASE 3 during which the negative program-read-verify voltage Vreadn is provided to the selected word line WL2 is defined as opposed to a normal pre-charge interval T2 in CASES 1 and 2 during which the positive program-read-verify voltage Vreadp is provided.

During the extended pre-charge interval T2', the negative program-read-verify voltage Vreadn is able to fully reach the level of the negative target voltage V3 and be maintained at this level for a sufficient period of time to ensure proper voltage conditioning of the selected bit line BL1. Thus, if the threshold voltage of the selected nonvolatile memory cell 21 is greater than the negative target voltage V3 when the negative program-read-verify voltage Vreadn is applied, then the selected nonvolatile memory cell 21 becomes an OFF-cell.

As illustrated in CASE 3 of FIG. 9, the selected nonvolatile memory cell 21 is an OFF-cell during the developing interval T3. Accordingly, the pre-charge voltage $V_{BL1n}$ applied to the selected bit line BL1 is sufficiently retained throughout the developing interval T3. As a result, the sense amplifier 73-7 will properly sense and output a data value of "1" having a high level during the sense interval T4. In this manner, embodiments of the inventive concept are able to increase the duration of a normal pre-charge interval T2 used when a positive read voltage Vreadp is applied to a selected word line to the extended pre-charge interval T2' when a negative read voltage Vreadn is applied. As a result, the selected nonvolatile memory cell 21 which may be erroneously sensed as an ON-cell in CASE 2 will be properly sensed as an OFF-cell in CASE 3 of FIG. 9.

Thus, the use of the second control signal VRCS2 to extend the normal pre-charge interval T2 has the effect of causing relatively more electrical charge to be applied to (and accumulate on) the selected bit line BL1, as compared with the first control signal VRCS1 corresponding to the normal (non-extended) pre-charge interval T2. However, this approach is just one example, consistent with various embodiments of the inventive concept, of many possible approaches whereby relatively more electrical charge may be applied, accumulated and/or retained on a selected bit line when a negative read voltage is applied to a corresponding word line during a read operation, as compared with a similar application of a positive read voltage.

Figure 10:
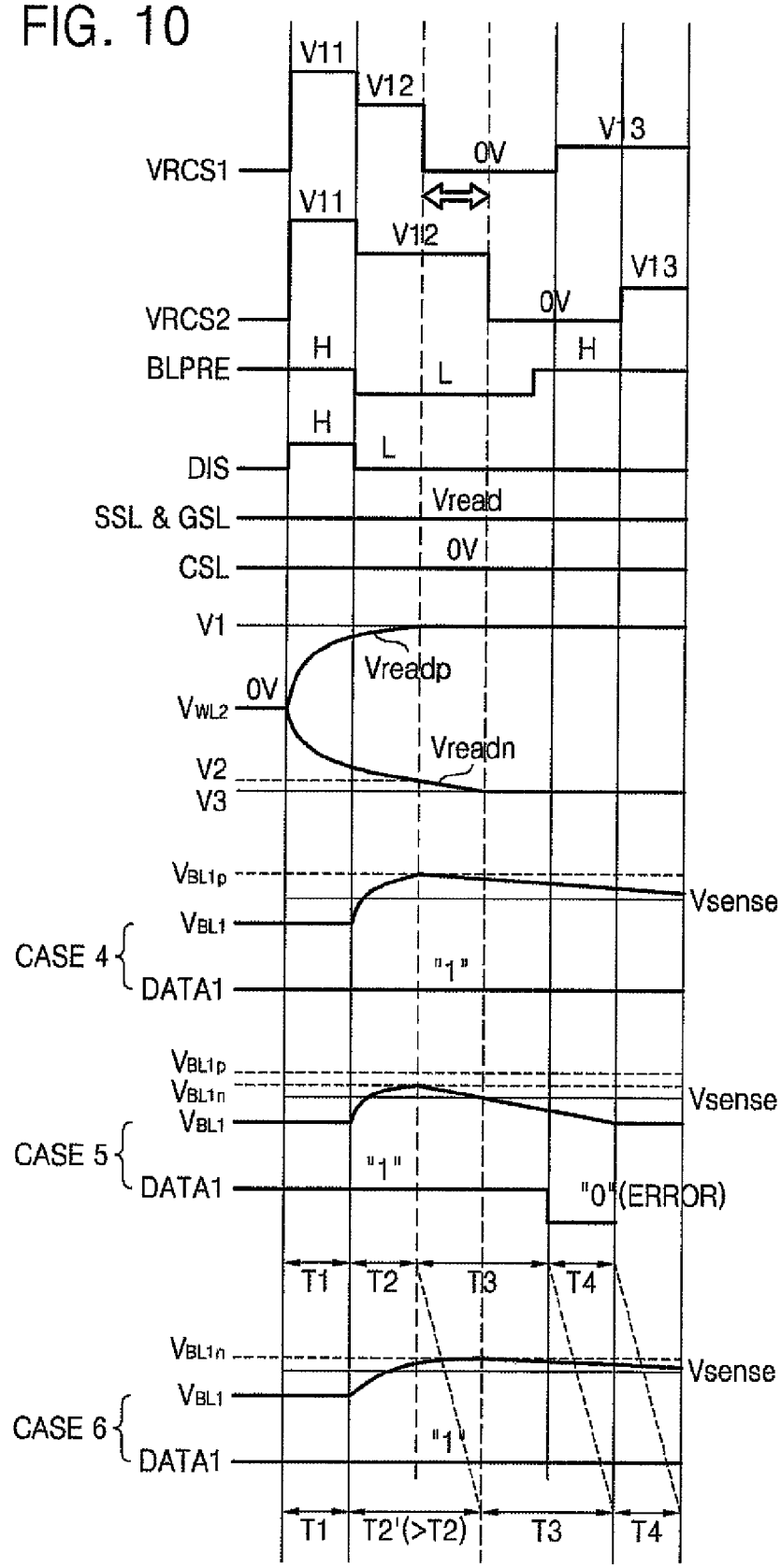
FIG. 10 is another related set of waveform diagrams for selected control signals, control voltages, and response defining another read operation executed within the nonvolatile memory device of FIG. 1.

FIG. 10 is another related waveform diagram illustrating applied control voltages (and corresponding responses) consistent with an additional three (3) working examples (CASE 4, CASE 5 and CASE 6). The different approach(es) taught by FIG. 10 are best understood when considered in comparison with the approach(es) taught by FIG. 9.

As previously explained, the positive read voltage Vread and the negative read voltage Vreadn (e.g., the program-read-verify examples) of FIG. 9 may be and are conventionally applied symmetrically with respect to an initial word line voltage (e.g., 0V). In contrast, the positive read voltage Vread and negative read voltage Vreadn (here again, program-read-verify examples are used) of FIG. 10 are applied to the selected word line asymmetrically.

In this context, the term "asymmetric" is an antonym for the term "symmetric", as previously described. Namely, the positive read voltage Vread and the negative read voltage Vreadn are asymmetrically applied when either: (1) they are applied to the selected word line over different time durations; or (2) they are applied to the selected word line with different voltage slope characteristics. In the example illustrated in FIG. 10, both of these asymmetrical conditions apply, since the negative read voltage Vreadn is applied to the selected word line for a longer time period and with a different (e.g. less steep) voltage slope characteristic as compared with the positive read voltage Vreadp. Thus, in the illustrated example of FIG. 10, the positive target voltage V1 associated with the positive program-read-verify voltage Vreadp remains as before and so does the negative target voltage V3 associated with the negative program-read-verify voltage Vreadn. However, in the example illustrated in FIG. 10, it takes longer for the negative program-read-verify voltage Vreadn to reach the negative target voltage V3 as compared with the time required for the positive program-read-verify voltage Vreadp to reach the positive target voltage V1.

It should be noted that the descriptive concepts of "symmetrical" and "asymmetrical", as described above in relation to various embodiments of the inventive concept should not be woodenly interpreted to demand a mathematical exactness that would dictate impractical real world implementations. Thus, "substantially symmetrical" or "substantially asymmetrical" over an approximate period of time and with respect to a nominal initial word line voltage will be practically understood by those skilled in the art in relation to the terms symmetrical and asymmetrical.

There are different approaches that may be used to effectively provide for the application of asymmetrical verse symmetrical negative and positive read voltages, as well as negative and positive read voltages that differently adjust the timing of a read operation interval. For example, the negative voltage generator 34 of voltage generator 30 may be relatively oversized in its current driving capacity relative to the positive voltage generator 32. This mismatched charge pumping (and commensurate voltage/current driving) capability may allow the negative voltage generator 34 to generate a negative read voltage Vreadn having by a steeper voltage slope characteristic as compared with the positive read voltage Vreadp over given period of time. This steeper voltage slope characteristic for the negative read voltage Vreadn will have the effect of increasing the rate at which charge is applied to the selected bit line BL1 in comparison with the charge applied during a similar application period for the positive read voltage Vreadp.

CASE 4 illustrated in FIG. 10 is essentially the same positive read voltage Vreadp application example described in relation to CASE 1 of FIG. 9. According, an explanation of CASE 4 will not be provided here. However, CASE 5 of FIG. 10 will be explained with collective reference to FIGS. 7, 8, and 10.

For CASE 5 illustrated in FIG. 10, the threshold voltage of the selected nonvolatile memory cell 21 is assumed to be between a middle voltage V2 and the target voltage V3 (See, region "C" in FIG. 8). Accordingly, when development of the selected bit line BL1 starts at the middle voltage V2 at a point less than the negative program-read-verify voltage Vreadn fully reaches the negative target voltage V3, the selected nonvolatile memory cell 21 may be determined to be an ON-cell or it may operate as an ON-cell although it is an OFF-cell. That is, nonvolatile memory cells having a threshold voltage residing in region "C" may be determined to be OFF-cells in relation to the target voltage V3, but ON-cells in relation to the middle voltage V2.

In CASE 5, following the normal pre-charge interval T2 when the negative program-read-verify voltage Vreadn is applied to the selected word line WL2 and reaches the middle voltage V2, the selected nonvolatile memory cell 21 remains as an ON-cell. Accordingly, the pre-charge voltage $V_{BL1n}$ apparent on the selected bit line BL1 may drop below the required sense voltage Vsense during the developing interval T3. Accordingly, the sense amplifier 73-7 will erroneously output a data value of "0" during the sense interval T4. Accordingly, the selected nonvolatile memory cell 21 will be sensed as an ON-cell although it is actually an OFF-cell.

To again address this unacceptable outcome and in view of CASE 6, nonvolatile memory devices according to embodiments of the inventive concept comprise operation control circuitry 11 including control logic 50 that provides multiple control signals VRCSi differentiated according to the type of read voltage (i.e., negative verses positive). At least one of these control signals (e.g., the second control signal VRCS2) may be used to increase the duration of a normal pre-charge interval T2 to that of an extended pre-charge interval T2'. As a result of this extended pre-charge interval T2', the operation of the page buffer 71-1 is adjusted within the nonvolatile memory device 10 and in relation to the application of a negative read voltage Vreadn applied to the selected word line WL2 in order to essentially provide more electrical charge to the selected bit line BL1.

The page buffer 71-1 will pre-charge the selected bit line BL1 with a pre-charge voltage $V_{BL1n}$ in response to the second control signal VRCS2 during the extended pre-charge interval T2'. That is, the page buffer 71-1 will perform a pre-charge operation on the selected bit line BL1 until the selected word line WL2 fully reaches the negative target voltage V3 associated with the negative program-read-verify voltage Vreadn. In this manner, the read-verify operation presented as a working example in CASE 6 of FIG. 10 may correctly read-verify the data state of the selected nonvolatile memory cell 21 even when it has a threshold voltage residing within the region C of the threshold distribution of FIG. 8.

As illustrated in FIGS. 9 and 10, the control logic 50 of certain embodiments of the inventive concept may maintain the discharge interval T1, developing interval T3, and sense interval T4 associated with a given read operation interval the same, regardless of whether a positive or negative control voltage is applied to the selected word line. That is, the illustrated examples of FIGS. 9 and 10, the discharge interval T1, developing interval T3, and sense interval T4 are not changed in their duration by application of the first control signal CRCS1 or the second control signal CRCS2. Rather, given a relatively reduced level for a target voltage associated with a negative read voltage Vreadn applied to a selected word line, the control logic 50 will increase the overall duration of the read interval by using an extended pre-charge interval (T2' rather than T2). In this manner, certain nonvolatile memory devices according to embodiments of the inventive concept may correctly read and read-verify the stored data state of nonvolatile memory cells, regardless of the relative voltage level (e.g., positive verse negative) of the corresponding threshold voltage distributions and associated target voltages (e.g., V1 verses V3).

Figure 11:
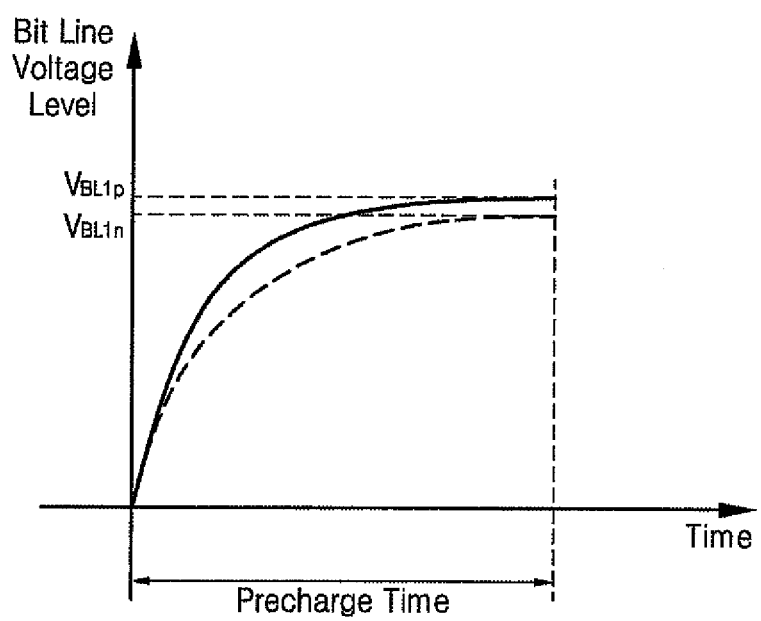
FIG. 11 further illustrates disparate pre-charge voltages apparent on a selected bit line and related to different operating schemes respectively using a positive read voltage and a negative read voltage.

FIG. 11 is a voltage/time waveform illustrating a first pre-charge voltage (solid line) apparent on a selected bit line during a read operation using a positive read voltage in comparison with a second pre-charge voltage (dashed line) for the same selected bit line during another read operation using a negative read voltage. Of note, the pre-charge period for both the first and second pre-charge voltages is the same in FIG. 11. As explained in relation to FIGS. 9 and 10, the peak value of the second pre-charge voltage $V_{BL1n}$ apparent on the selected bit line BL1 when the negative program-read-verify voltage Vreadn is applied to the selected word line WL2 is less than the first pre-charge voltage $V_{BL1p}$ apparent on the selected bit line BL1 when the positive program-read-verify voltage Vreadp is applied to the selected word line. Moreover, the speed with which the respective pre-charge voltages charge the selected bit line BL1 are different. The first pre-charge voltage $V_{BL1p}$ pre-charges the selected bit line BL1 faster than the second pre-charge voltage $V_{BL1n}$. This result arises because the selected nonvolatile memory cell 21 operates as an OFF-cell until the positive program-read-verify voltage Vreadp reaches the positive target voltage V1, yet operates as an ON-cell until the negative program-read-verify voltage Vreadn reaches the negative target voltage T3.

Figure 12:
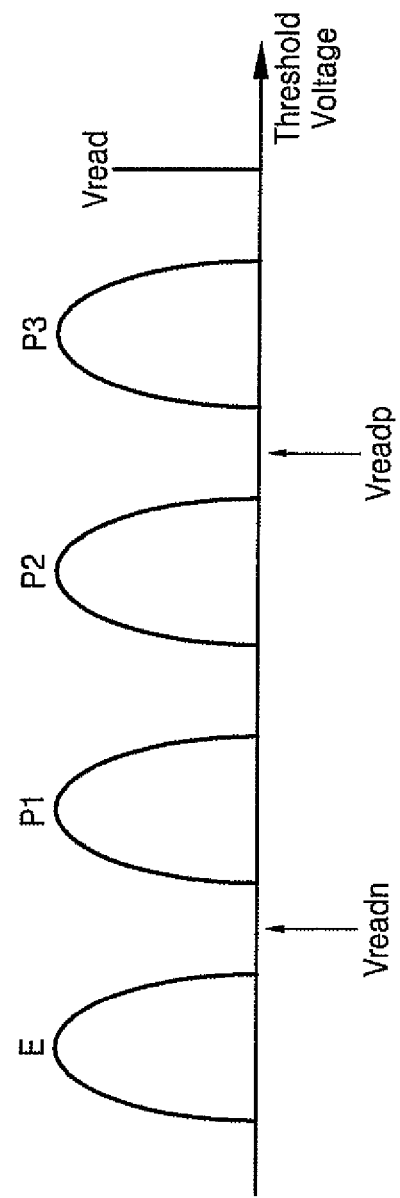
FIG. 12 illustrates a collection of threshold voltage distributions for a 2-bit MLC susceptible to incorporation within embodiments of the inventive concept, such as the nonvolatile memory device of FIG. 1.

FIG. 12 illustrates threshold voltage distributions for an exemplary 2-bit MLC including one erase data state E, and three (3) programmed data states P1, P2, and P3. Such a MLC may be readily incorporated into the memory cell array 20 of the nonvolatile memory device of FIG. 1.

Referring collectively to FIGS. 1, 2, 3, 5, 9, 10 and 12, an exemplary read operation executed in relation to the nonvolatile memory device 10 according to certain embodiments of the inventive concept will be explained. Each of a plurality of 2-bit MLCs may be two-dimensionally or three-dimensionally arranged in a memory cell array 20 per the discussion given above in relation to FIGS. 2 and 3. Those skilled in the art will also recognize that 3-bit or higher MLCs might additionally or alternately be incorporated within the memory cell array 20.

FIG. 12 further illustrates a negative read voltage Vreadn defined between the erase state E1 and the first programmed state P1 and a positive read voltage Vreadp defined between the second programmed state P2 and the third programmed state P3. However, those skilled in the art will recognize that the negative read voltage(s) Vreadn and positive read voltage(s) Vreadp may be variously defined in relation to a given arrangement of threshold voltage distributions.

As illustrated in FIG. 5, the positive read voltage Vreadp is applied to the selected word line WL2 during a read operation while the normal read voltage Vread is applied to the non-selected word lines WL1 and WL3 to WLn, string selection line SSL and ground selection line GSL voltage Vread. Under these voltage bias conditions, a selected nonvolatile memory cell 21 storing a data value of 11 may be properly read as an OFF-cell in relation to the third programmed state P3 on a basis of the positive read voltage Vreadp illustrated in FIG. 12. However, when the threshold voltage of the selected nonvolatile memory cell 21 resides in the erase state E, the first programmed state P1, or the second programmed state P2—all less than the positive read voltage Vreadp, the selected nonvolatile memory cell 21 may be read as ON-cell.

As illustrated in FIG. 7, the negative read voltage Vreadp is applied to the selected word line WL2 during a read operation while the normal read voltage Vread is applied to the non-selected word lines WL1 and WL3 to WLn, string selection line SSL and ground selection line GSL voltage Vread. Under these voltage bias conditions, a selected nonvolatile memory cell 21 storing a data value of 00 may be properly read as an OFF-cell in relation to the erase state E on a basis of the negative read voltage Vreadn illustrated in FIG. 12. However, when the threshold voltage of the selected nonvolatile memory cell 21 resides in the first through third programmed states P1, P2, P3—all greater than the negative read voltage Vreadn, the selected nonvolatile memory cell 21 may be read as ON-cell.

As illustrated in FIGS. 9 and 10, the control logic 50 generates a control signal VRCSi that may increase the overall read operation interval by extending the pre-charge interval T2' when a negative read voltage Vreadn is applied to a selected word line, as compared with a normal pre-charge interval T2 when a positive read voltage Vreadp is applied to the selected word line. However, embodiments of the inventive concept are not limited to only this type of read operation interval adjustment. For example, control signal(s) generated by the control logic 50 may adjust (i.e., increases or decrease) at least one of the discharge interval DCT, pre-charge interval PT, developing interval DVT and sense interval ST in accordance with the type (positive or negative) of read voltage applied to the selected word line. In more specific embodiments of the inventive concept, the timing of either one or both of the discharge interval DCT and developing interval DVT may be adjusted to thereby expand the pre-charge interval PT without necessarily extending the overall duration of the read operation interval. Alternately, the discharge interval DCT within a read operation may be extended to effectively advance the point at which pre-charging of the selected bit line occurs.

Still further, the operation of a nonvolatile memory device according to embodiments of the inventive concept, such as the one illustrated in FIG. 1 may obtain similar results without necessarily adjusting the timing of a read interval. Instead, the relative timing of a word line control voltage and a corresponding bit line voltage may be adjusted on the basis of whether a positive threshold voltage or a negative threshold voltage is implicated in a read operation. For example, during a read operation applying a positive read voltage to a selected word line, a corresponding bit line voltage may be applied to the selected bit line in a conventional manner. However, during a read operation applying a negative read voltage to the selected word line, application of the corresponding bit line voltage may delayed to the selected bit line, such that application of the bit line voltage occurs during an interval wherein the negative read voltage is already transitioning from the initial word line voltage to a negative target voltage.

This relative temporal adjustment in the application timing of a bit line voltage has the effect of increasing the electrical charge accumulated on the selected bit line to analogously compensate for the potentially adverse effects of the negative read voltage application as compared with the positive read voltage application.

However, returning to the concept of adjusting the timing of a read operation interval, the relevant control signal(s) may be applied to one or more components blocks of the operation control circuitry 11 including the page register & sense amplifier block 70. Thus, read operation interval adjustment may be accomplished using only the page register & sense amplifier block 70 or in conjunction with other components to effectively increase or decrease the read operation interval or a constituent sub-interval(s) in accordance with a corresponding control signal VRCSi.

Figure 13:
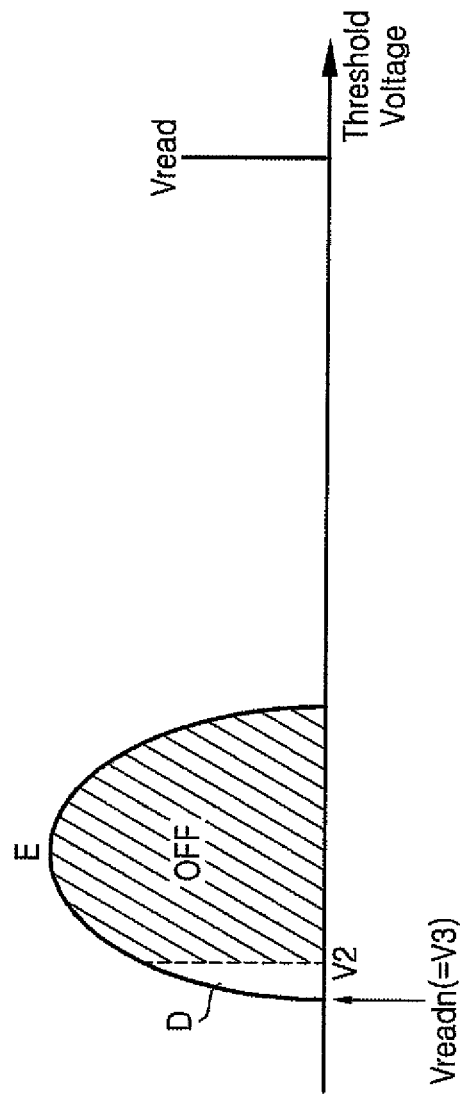
FIG. 13 illustrates a threshold voltage distribution for the nonvolatile memory cell of having a erase-read-verify voltage applied to the selected word line.

FIG. 13 illustrates a threshold distribution associated with an erase state E. An erase operation executed by the nonvolatile memory device of FIG. 1 is designed to ensure that the threshold voltage of selected memory cell(s) receiving the erase operation subsequently reside in a threshold distribution associated with the erase state E. An exemplary erase-read-verify operation will be explained with reference to FIGS. 7, 10 and 13.

It is assumed that the threshold voltage of the selected memory cell 21 resides in a tail region "D" of FIG. 13 and a negative read voltage Vreadn is applied to the selected word line WL2 as a negative erase-verify voltage. Like CASE 5 of FIG. 10, if a developing interval starts when a voltage $V_{WL2}$ supplied to the selected word line WL2 reaches a middle voltage V2 prior to the target voltage V3 of the negative erase verify voltage, nonvolatile memory cells having threshold voltages residing in region D may be determined to be ON-cells although they are actually OFF-cells.

To again address this unacceptable outcome, the control logic 50 generates the second control signal VRCS2 and applies it to the page register & sense amplifier block 70 when the negative erase-read-verify voltage Vreadn is applied to the selected word line WL2. Accordingly, the page register & sense amplifier block 70 may perform an erase verify operation similar to CASE 6 of FIG. 10 under the control of the second control signal VRCS2. Thus, the foregoing examples include both program-read-verify operations and erase-read-verify operations as definitive examples of read operations susceptible to operational improvement provided by embodiments of the inventive concept.

Figure 14:
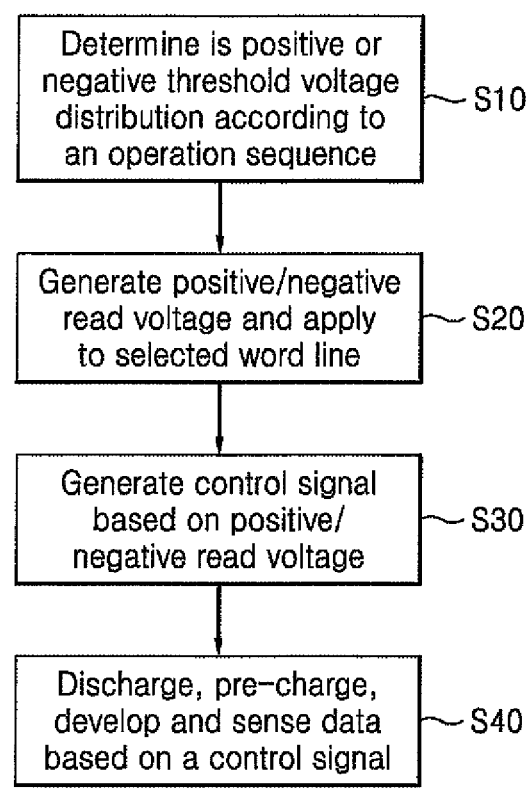
FIG. 14 is a flowchart summarizing an exemplary method of operating an embodiment of the inventive concept, such as the nonvolatile memory device of FIG. 1.

FIG. 14 is a flowchart summarizing a general method of operating a nonvolatile memory device, such as the one illustrated in FIG. 1, according to embodiments of the inventive concept. Referring collectively to FIGS. 1 through 14, the control logic 50 of the operation control circuitry 11 may be used during a read operation to determine whether an implicated threshold voltage distribution and corresponding target voltage are negative or positive (S10). In this context, the term "implicated" means a defined threshold voltage distribution to which the current threshold voltage of selected memory cell(s) will be referenced to discriminate a data state. This determination will typically be made according to a read operation sequence for the nonvolatile memory device 10 as is conventionally well understood.

Once the determination of a negative/positive threshold voltage distribution (and/or corresponding negative/positive target voltage) have been made, the control logic 50 will generate appropriate control signals CTRL instructing the voltage generator 30 to generate either a positive read voltage Vreadp or a negative read voltage Vreadn using, for example, the positive voltage generator 32 or the negative voltage generator 34. Once generated, the positive or negative read voltage will be applied to a selected word line via the row decoder 40 in response to the externally provided row addresses XADD (S20). While the positive read voltage Vreadp or negative read voltage Vreadn is being generated and applied to the selected word line WL2, the control signal logic 54 of the control logic 50 may be used to generate a control signal VRCSi appropriately adjusting the read operation interval timing according to a nature (positive/negative) of the applied read voltage (S30).

The page buffer 71-1 may then perform a discharge operation, a pre-charge operation, a developing operation or a sense operation in relation to the selected bit line BL1 in accordance with the applied control signal (S40). Accordingly, the page buffer 71-1 may properly discriminate a stored data state regardless of the type (positive or negative) of read voltage being applied to the selected word line, and regardless of the exact level of the current threshold voltage and/or programmed state for the selected nonvolatile memory cell.

So far embodiments of the inventive concept have been presented in the context of nonvolatile memory devices and methods of operating same. However, the scope of the inventive concept subsumes many types of memory systems and host devices incorporating one or more nonvolatile memory devices consistent with the foregoing.

Figure 15:
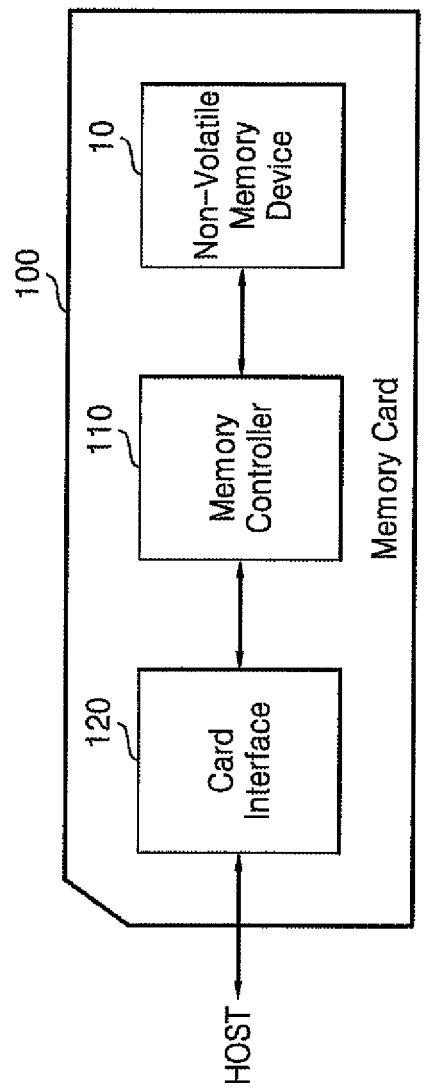
FIG. 15 is a general block diagram of a memory system incorporating a nonvolatile memory device according to an embodiment of the inventive concept, such as the nonvolatile memory device of FIG. 1.

For example, FIG. 15 is a general block diagram illustrating one possible memory system 100 capable of incorporating a nonvolatile memory device according to embodiments of the inventive concept, such as the one described in relation to FIG. 1. In certain embodiments, the memory system 100 takes the form of a memory card 100. The memory card 100 generally comprises a memory controller 110, a host-card interface 120, and one or more nonvolatile memory device(s) 10. The memory card 100 may take many different physical forms including that of a smart card.

As is conventionally appreciated, the memory controller 110 will control an exchange of data between the nonvolatile memory device 10 and the card interface 120. In operation, the memory controller may issue the commands (CMD) received by the control logic 50 that dictate overall operation of the nonvolatile memory device 10.

The card interface 120 may operate in relation to one or more conventionally understood data communication protocol(s). In certain embodiments, the card interface 120 may be a secure digital (SD) card interface or a multi-media card (MMC) interface.

When the memory system 100 is connected to the host such as a computer, a digital camera, a digital audio player, a cellular phone, a console video game hardware, or a digital set-top box, a processor or controller incorporated within the memory controller 110 may control the communication of data between the host and the nonvolatile memory device 10.

Figure 16:
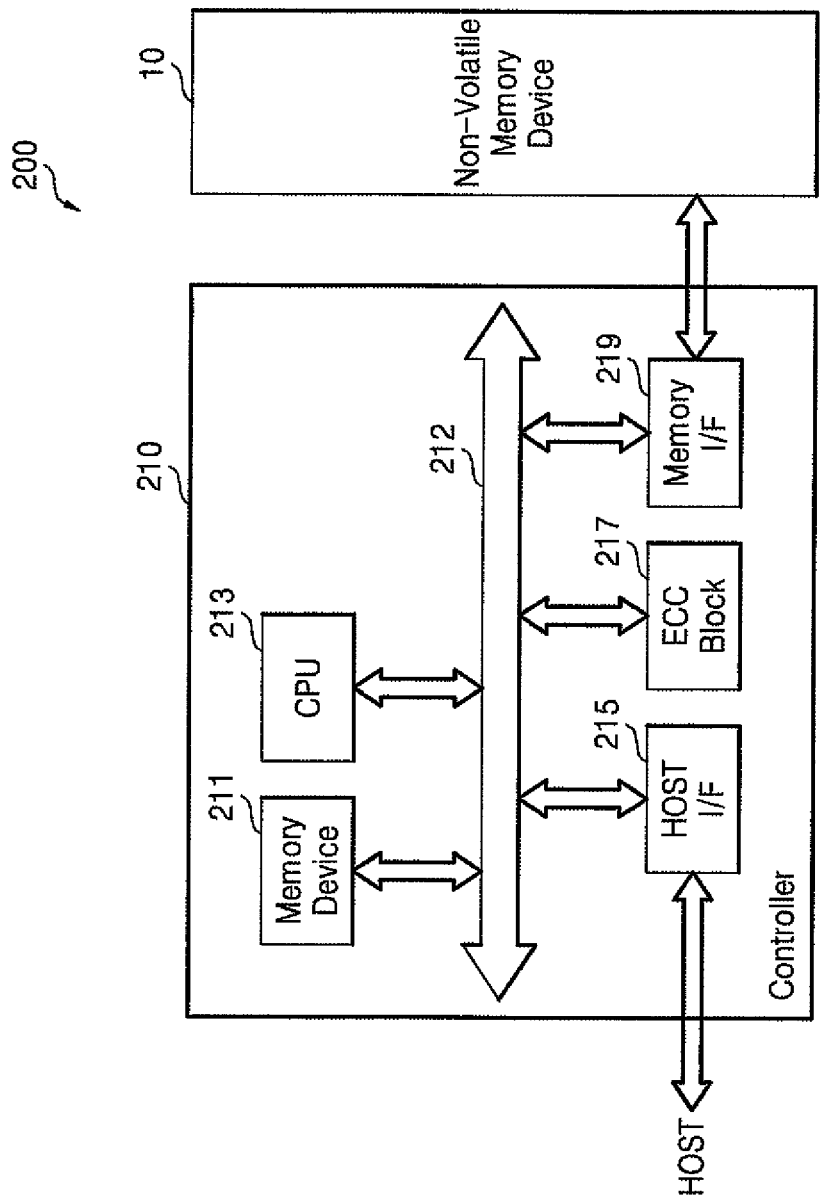
FIG. 16 is another general block diagram of a memory system incorporating a nonvolatile memory device according to an embodiment of the inventive concept, such as the nonvolatile memory device of FIG. 1.

FIG. 16 is a block diagram illustrating another example of a memory system capable of incorporating a nonvolatile memory device according to embodiments of the inventive concept, like the one illustrated in FIG. 1. Referring to FIG. 16, the memory system 200 may include a nonvolatile memory device 10 in the form of a flash memory device capable of adjusting a read operation interval in accordance with the type (positive/negative) of read voltage being applied to a selected word line. Memory system 200 generally comprises a memory controller 210 controlling the overall operation of the nonvolatile memory device 10.

The memory controller 210 comprises a central processing unit (CPU) 213 and a memory device 211 which may be used as an operating memory for the CPU 213. The memory device 211 may be variously embodied, such as by a dynamic random access memory (DRAM), a static RAM (SRAM), and/or a nonvolatile ROM.

The memory controller 210 further comprises a host interface (I/F) 215 enabling an exchange of data between a host and the memory controller 210 according to an established protocol; an error correction code (ECC) block 217 capable of detecting/correcting error(s) potentially arising in read data retrieved from the nonvolatile memory device 10; and a memory interface (I/F) 219 enabling an exchange of data between the nonvolatile memory device 10 and the memory controller 210.

The CPU 213 may control the various exchanges of data between the memory device 211, the host I/F 215, an ECC block 217 and the memory I/F 219 via a common bus 212. In certain embodiments, the memory system 200 may be embodied as a universal serial bus (USB) flash drive or a memory stick.

Figure 17:
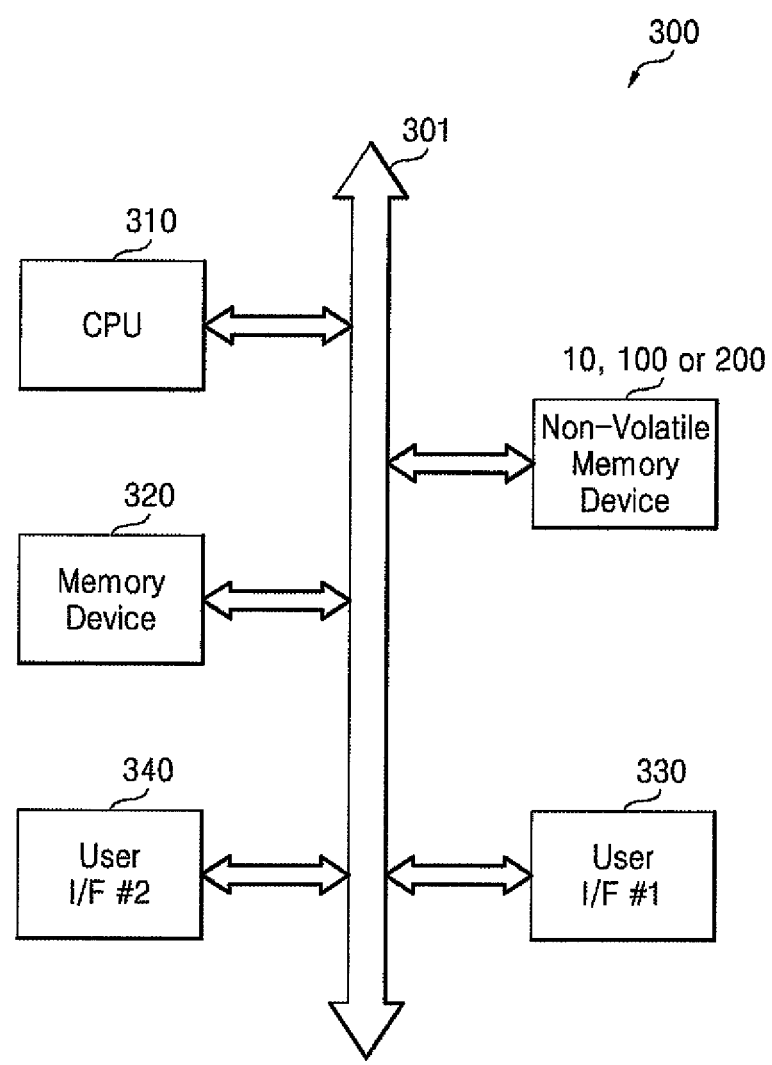
FIG. 17 is still another general block diagram of a memory system incorporating a nonvolatile memory device according to an embodiment of the inventive concept, such as the nonvolatile memory device of FIG. 1.

FIG. 17 is a block diagram illustrating yet another example of a memory system capable of incorporating a nonvolatile memory device according to embodiments of the inventive concept, like the one illustrated in FIG. 1. Referring to FIG. 17, the memory system 300 may be incorporated within various host device such as a cellular phone, a smart phone, a personal digital assistant (PDA), a digital camera, a portable game console, a MP3 player, a high-definition television (HDTV), a global positioning system (GPS), a navigator, a consumer equipment (CE), a digital set-top box or an information technology (IT) device.

The memory system 300 comprises a CPU 310 and a nonvolatile memory device 10 connected via a bus 301. According to certain embodiments, the memory device 320 of FIG. 17 may take the form of the nonvolatile memory device 10 described in FIG. 1, or the memory system 100 or 200 described in FIGS. 15 and 16. The CPU 310 may control operations of the nonvolatile memory device 10 or the memory system 100 or 200, (e.g., program, read, an erase operations).

The memory device 320 connected via the bus 301 may be used as an operating memory for the CPU 310. Thus, the memory device 320 may be variously embodied as a DRAM or SRAM. The memory device 320 may embodied as a memory module, e.g., a single in-line memory module (SIMM) or a dual in-line memory module (DIMM), including one or more nonvolatile memory devices 10 as described in relation to FIG. 1.

The memory system 300 may further comprise a first user interface 330 such as a display or a touch pad, and/or a second user interface 340 such as an input/output interface like a printer, keyboard and/or mouse.

According to certain embodiments, the first user interface 330 may be replaced with a CMOS image sensor. Accordingly, the CMOS image sensor may convert an optical image into digital data under a control of the CPU 310 and then store the digital data in the memory device 320.

Figure 18:
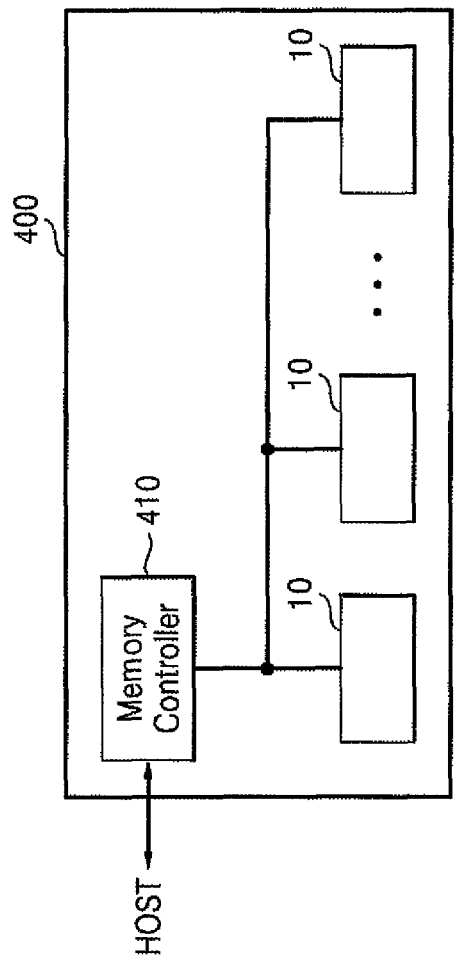
FIG. 18 is yet another general block diagram of a memory system incorporating a nonvolatile memory device according to an embodiment of the inventive concept, such as the nonvolatile memory device of FIG. 1.

FIG. 18 is a block diagram illustrating yet another example of a memory system capable of incorporating a nonvolatile memory device according to embodiments of the inventive concept, like the one illustrated in FIG. 1. Referring to FIG. 18, the memory system 400 may be embodied as a data storage device such as a solid state drive (SSD). The memory system 400 generally comprises a plurality of nonvolatile memory devices 10 and a memory controller 410 controlling the operation of the plurality of nonvolatile memory devices 10. Consistent with embodiments of the inventive concept, each of the plurality of nonvolatile memory devices 10 may be configured to adjust a read operation interval timing as described above.

Figure 19:
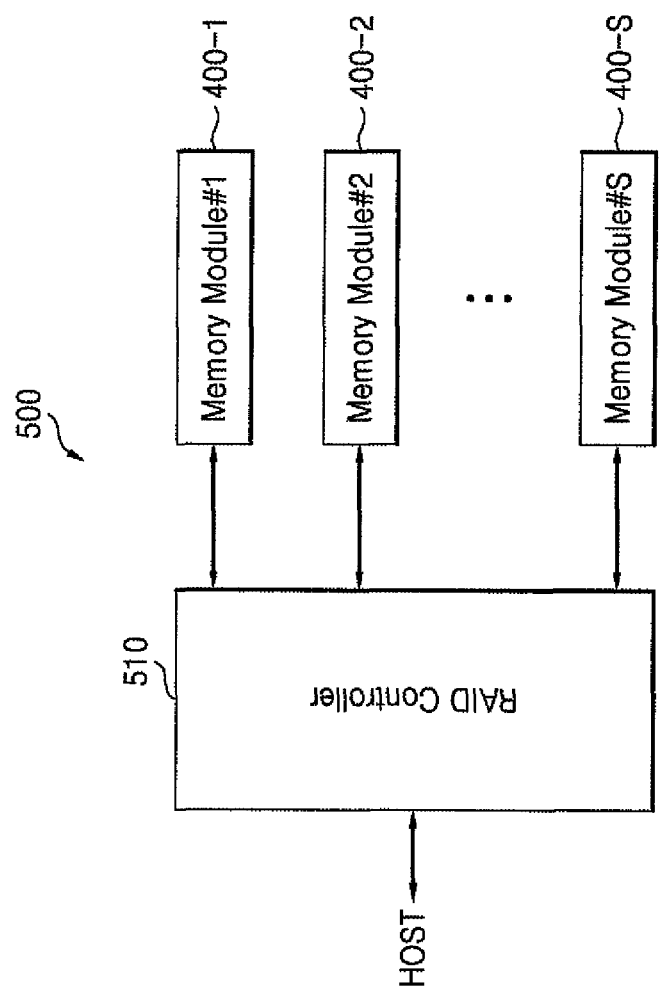
FIG. 19 is a general block diagram of a data storage device including the memory system according to an embodiment of the inventive concept, such as the one illustrated in FIG. 18.

FIG. 19 is a block diagram illustrating a data storage device capable of incorporating a nonvolatile memory system according to embodiments of the inventive concept, like the one illustrated in FIG. 18. Referring to FIGS. 18 and 19, a data storage device 500, which may be embodied as a RAID system, may include a RAID controller 510 and a plurality of memory modules 400-1 to 400-S. Each of the plurality of memory modules 400-1 to 400-S may be a memory system like the one illustrated in FIG. 18. The plurality of memory modules 400-1 to 400-S may thus comprise a RAID array. The data storage device 500 may be embodied as a personal computer (PC), tablet PC, or a SSD.

As has been described in the context of multiple embodiments, nonvolatile memory device(s) according to the inventive concept enjoy improved immunity to read operation failures that might otherwise arise due to functional mismatches occurring as the result of a positive read voltage application to a selected word line verses a negative read voltage application. In certain embodiments of the inventive concept the positive and negative read voltages are applied asymmetrically to avoid this outcome. Alternately or additionally, the timing of the read interval (or sub-intervals forming the read interval) may be adaptively adjusted to compensate for the disparate effects of applying a negative verses positive read voltage to a selected word line.

Although certain embodiments of the inventive concept have been illustrated and described, those skilled in the art will appreciate that the scope of the inventive concept is not limited to only these embodiments. Rather, the scope of the inventive concept is defined by the following claims and their equivalents.

What is claimed is:

1. A nonvolatile memory device comprising:
a nonvolatile memory cell; and
operation control circuitry comprising control logic configured to apply either a positive read voltage or a negative read voltage to a selected word line connected to the nonvolatile memory cell, and further configured to adjust timing of a read operation interval for a read operation determining a data state for the nonvolatile memory cell based on whether the positive read voltage or the negative read voltage is applied to the selected word line.

2. The nonvolatile memory device of claim 1, wherein the read operation is a program-read-verify operation, or an erase-read-verify operation.

3. The nonvolatile memory device of claim 1, wherein the control logic is further configured to control generation of either the positive read voltage or negative read voltage, and generation of either a first control signal defining a first read operation interval during which the positive read voltage is applied to the selected word line or a second control signal defining a second read operation interval during which the negative read voltage is applied to the selected word line.

4. The nonvolatile memory device of claim 3, wherein the first and second read operation intervals respective comprise a discharge interval, a pre-charge interval, a developing interval, and a sensing interval.

5. The nonvolatile memory device of claim 4, wherein and the second read operation interval is longer in duration than the first read operation interval.

6. The nonvolatile memory device of claim 4, wherein the pre-charge interval of the second read operation interval is longer in duration than a pre-charge interval of the first read operation interval.

7. The nonvolatile memory device of claim 1, wherein the operation control circuitry comprises:
a voltage generator configured to generate the positive read voltage and the negative read voltage under the control of the control logic; and
a page register and sense amplifier block configured to define the first read operation interval in response to the first control signal and the second read operation interval in response to the second control signal.

8. A nonvolatile memory device comprising:
a nonvolatile memory cell; and
operation control circuitry configured to apply a positive read voltage to a selected word line connected to the nonvolatile memory cell if the nonvolatile memory cell has a positive threshold voltage, and apply a negative read voltage to the selected word line if the nonvolatile memory cell has a negative threshold voltage,
wherein the positive read voltage and negative read voltage are applied asymmetrical over a portion of a read operation interval and with respect to an initial word line voltage of the selected word line.

9. The nonvolatile memory device of claim 8, wherein the negative read voltage is applied to the selected word line over a longer portion of the read operation interval than the positive read voltage.

10. The nonvolatile memory device of claim 8, wherein the negative read voltage is applied to the selected word line in relation to a negative target voltage with a different voltage slope characteristic than the positive read voltage applied to the selected word line in relation to a positive target voltage.

11. A memory card comprising:
a card interface configured to receive data and a corresponding command from a host device;
a controller configured to control an exchange of the data between the card interface and a nonvolatile memory device, wherein the nonvolatile memory device comprises; a nonvolatile memory cell, and operation control circuitry comprising control logic configured to apply either a positive read voltage or a negative read voltage to a selected word line connected to the nonvolatile memory cell, and further configured to adjust timing of a read operation interval for a read operation determining a data state for the nonvolatile memory cell based on whether the positive read voltage or the negative read voltage is applied to the selected word line.

12. A memory system, comprising:
the nonvolatile memory device comprising a nonvolatile memory cell, and operation control circuitry comprising control logic configured to apply either a positive read voltage or a negative read voltage to a selected word line connected to the nonvolatile memory cell, and further configured to adjust timing of a read operation interval for a read operation determining a data state for the nonvolatile memory cell based on whether the positive read voltage or the negative read voltage is applied to the selected word line; and
a controller configured to control operation of the nonvolatile memory device.

13. A solid state drive (SSD), comprising:
a plurality of nonvolatile memory devices, each comprising:
a nonvolatile memory cell; and
operation control circuitry comprising control logic configured to apply either a positive read voltage or a negative read voltage to a selected word line connected to the nonvolatile memory cell, and further configured to adjust timing of a read operation interval for a read operation determining a data state for the nonvolatile memory cell based on whether the positive read voltage or the negative read voltage is applied to the selected word line; and
a controller connected to the plurality of nonvolatile memory devices and configured to control operation of the plurality of nonvolatile memory devices and an exchange of data between the plurality of nonvolatile memory devices and a host device.

* * * * *